US012811564B2

(12) United States Patent
Dong et al.

(10) Patent No.: US 12,811,564 B2
(45) Date of Patent: Nov. 24, 2026

(54) BULK ACOUSTIC WAVE RESONANCE STRUCTURE AND MANUFACTURING METHOD

(71) Applicant: WUHAN GRANDEUR MICROELECTRONICS CO., LTD., Wuhan (CN)

(72) Inventors: Yuxuan Dong, Wuhan (CN); Zhi Wei Koh, Wuhan (CN); Re-Ching Lin, Wuhan (CN)

( * ) Notice: Subject to any disclaimer, the term of this patent is extended or adjusted under 35 U.S.C. 154(b) by 350 days.

(21) Appl. No.: 18/682,891

(22) PCT Filed: Jul. 28, 2023

(86) PCT No.: PCT/CN2023/109804
§ 371 (c)(1),
(2) Date: Feb. 9, 2024

(87) PCT Pub. No.: WO2025/024968
PCT Pub. Date: Feb. 6, 2025

(65) Prior Publication Data
US 2026/0128726 A1 May 7, 2026

(51) Int. Cl.
*H03H 9/17* (2006.01)
*H03H 3/02* (2006.01)
*H03H 9/02* (2006.01)

(52) U.S. Cl.
CPC .............. *H03H 9/171* (2013.01); *H03H 3/02* (2013.01); *H03H 9/02007* (2013.01); *H03H 9/02866* (2013.01)

(58) Field of Classification Search
CPC ...... H03H 9/171; H03H 3/02; H03H 9/02007; H03H 9/02866
(Continued)

(56) References Cited

U.S. PATENT DOCUMENTS 9,219,464 B2 12/2015 Choy
10,608,611 B2 3/2020 Tajic
(Continued)

FOREIGN PATENT DOCUMENTS

CN 103733515 A 4/2014
CN 109546985 A 3/2019
(Continued)

OTHER PUBLICATIONS

International Search Report in the international application No. PCT/CN2023/109804, mailed on Dec. 22, 2023. 8 pages with English translation.

*Primary Examiner* — Andrea Lindgren Baltzell
*Assistant Examiner* — Victor Cole
(74) *Attorney, Agent, or Firm* — SYNCODA LLC; Feng Ma

(57) ABSTRACT

A bulk acoustic wave resonator includes: a substrate; a reflective structure, a first electrode layer, a piezoelectric layer, and a second electrode layer which are sequentially stacked on the substrate; and a suspended protruding block. The suspended protruding block is located on the piezoelectric layer outside an edge region and at least surrounds a first region, with a gap structure located between the suspended protruding block and the piezoelectric layer in the first region, and between the suspended protruding block and the second electrode layer in the first region. The top surface of the suspended protruding block is higher than the top surface of the second electrode layer, and the first region includes a portion of a non-resonance region adjacent to a resonance region.

19 Claims, 13 Drawing Sheets

(58) Field of Classification Search
USPC .......................................................... 333/187
See application file for complete search history.

(56) References Cited

U.S. PATENT DOCUMENTS

| | | | | |
|---|---|---|---|---|
| 2011/0148547 | A1* | 6/2011 | Zhang ................ | H03H 9/02118 333/187 |
| 2014/0125202 | A1 | 5/2014 | Choy | |
| 2016/0308509 | A1* | 10/2016 | Burak .................... | H03H 9/132 |
| 2018/0152168 | A1* | 5/2018 | Han ................... | H03H 9/02118 |

FOREIGN PATENT DOCUMENTS

| | | | |
|---|---|---|---|
| CN | 113872553 | A | 12/2021 |
| CN | 114006595 | B | 3/2022 |
| CN | 217693272 | U | 10/2022 |
| CN | 115276598 | A | 11/2022 |
| CN | 115395917 | A | 11/2022 |
| CN | 115913162 | A | 4/2023 |
| DE | 102016123708 | B3 | 4/2018 |

* cited by examiner

BULK ACOUSTIC WAVE RESONANCE STRUCTURE AND MANUFACTURING METHOD

CROSS-REFERENCE TO RELATED APPLICATION

This application is a U.S. National Stage of International Application No. PCT/CN2023/109804 filed on Jul. 28, 2023, the disclosure of which is hereby incorporated by reference in its entirety.

TECHNICAL FIELD

Embodiments of the disclosure relate to, but are not limited to, a bulk acoustic wave resonator and a manufacturing method.

BACKGROUND

A Film Bulk Acoustic Wave Resonator (FBAR), which is also referred to as a bulk acoustic wave resonator, has advantages such as small size and high Quality Factor (Q value), and is widely used in mobile communication technologies, such as a filter or duplexer in a mobile terminal.

On one hand, as can be seen from the research trend of bulk acoustic wave resonators in recent years, development of bulk acoustic wave resonators at home and abroad has entered into a large-scale commercialization stage, and research based on theory and process has become mature. On the other hand, with the increasing of signal formats that are sent and received, more radio frequency (RF) front-end modules will be added into the system, which greatly improves the concentration and isolation requirements of the filter and diplexer. In such case, the needs of the rapid development of communication technologies can be met only by continuously improving the performance of the filter per se.

SUMMARY

Embodiments of the disclosure provide a bulk acoustic wave resonator, including: a substrate; a reflective structure, a first electrode layer, a piezoelectric layer, and a second electrode layer which are sequentially stacked on the substrate; and a suspended protruding block. The suspended protruding block is located on the piezoelectric layer outside an edge region and at least surrounds the edge region, with a gap structure located between the suspended protruding block and the piezoelectric layer in the edge region, and between the suspended protruding block and the second electrode layer in the edge region. A top surface of the suspended protruding block is higher than a top surface of the second electrode layer, and the edge region includes a portion of a non-resonance region adjacent to a resonance region.

Embodiments of the disclosure further provide a manufacturing method of a bulk acoustic wave resonator, including the following operations. A substrate is provided. A reflective structure, a first electrode layer, a piezoelectric layer, and a second electrode layer, which are sequentially stacked on the substrate, are formed. A suspended protruding block is formed. The suspended protruding block is located on the piezoelectric layer outside an edge region and at least surrounds the edge region, with a gap structure located between the suspended protruding block and the piezoelectric layer in the edge region, and between the suspended protruding block and the second electrode layer in the edge region. A top surface of the suspended protruding block is higher than a top surface of the second electrode layer, and the edge region includes a portion of a non-resonance region adjacent to a resonance region.

DETAILED DESCRIPTION

Figure 1:
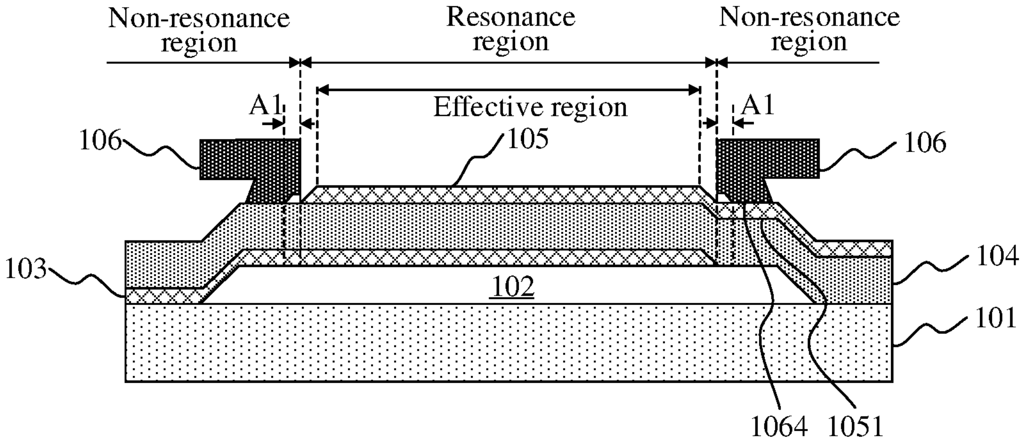
FIG. 1 is a section schematic diagram of a first bulk acoustic wave resonator according to an embodiment of the disclosure.

The technical solutions of the disclosure are further described in detail below in conjunction with the drawings and embodiments. Although exemplary implementation methods of the disclosure are shown in the drawings, it may be understood that the disclosure may be realized in various forms without being limited by the implementation methods described here. Conversely, the implementation methods are provided such that the disclosure may be understood more thoroughly, and the scope of the disclosure may be fully communicated to those skilled in the art.

In the following paragraphs, the disclosure is described more specifically by way of examples with reference to the drawings. Advantages and features of the disclosure will become clearer according to the following illustration. It is to be noted that the drawings are in a very simplified form and on an imprecise scale, and are used only for auxiliary illustration of the embodiments of the disclosure in a convenient and lucid manner.

In the embodiments of the disclosure, the terms “first”, “second”, or the like are used to distinguish similar objects and need not to be used to describe a particular order or precedence.

It is to be noted that the technical solutions described in the disclosure may be combined with each other in any combination without conflict.

The main parameters of a bulk acoustic wave resonator include the electromechanical coupling coefficient ($Kt^2$), the Quality Factor (Q value), or the like. It is of great importance in filter design to increase the Q value of the resonator when the $Kt^2$ of the resonator is kept relatively large. A higher global quality factor Q value (including Qs value, which affects the series connection, and Qp value, which affects the parallel connection) of multiple resonators in an acoustic wave device represents less energy loss in the acoustic wave device and better device performance. It is of great importance in acoustic wave device design to choose an appropriate Qs value (affecting the series connection) and Qp value (affecting the parallel connection). For acoustic wave devices with multiple series resonators, a high Qs value is required, and for acoustic wave devices with multiple parallel resonators, a high Qp value is required.

Appropriate parameters of the resonator structure are set according to the connection manner of the multiple resonator circuits in the acoustic wave device, such that a higher global quality factor Q value (including Qs value, which affects the series connection, and Qp value, which affects the parallel connection) of the multiple resonators in the acoustic wave device has a practical significance.

In the related art, when electrical energy is exerted to the upper and lower electrodes of a bulk acoustic wave resonator, the piezoelectric layers located in the upper and lower electrodes generate acoustic waves due to the piezoelectric effect. In addition to longitudinal waves, transverse shear waves, which may also be referred to as lateral or shear waves, are generated in the piezoelectric layer. The presence of transverse shear waves affects the energy of the main longitudinal wave, and the transverse shear waves cause energy loss and deteriorate the Q value of the bulk acoustic wave resonator. Based on this, one method for improving the Q value of the bulk acoustic wave resonator is to suppress the transverse shear waves, so as to prevent the transverse shear waves from propagating from the resonance region to external regions, thereby reducing energy leakage.

In some embodiments, arranging a suspended protruding block at the edge of the resonance region on the piezoelectric layer of the bulk acoustic wave resonator may suppress the propagation of the transverse shear waves to external regions, confine the energy into the resonance region, reduce parasitic resonance and improve the Q value. Furthermore, according to the connection manner of the multiple resonator circuits in the acoustic wave device, the protruding block is arranged at an appropriate location in the resonator, so as to further improve the global quality factor Q value (including Qs value, which affects the series connection, and Qp value, which affects the parallel connection) of the multiple resonators in the acoustic wave device.

In view of the above, in order to solve one or more of the above problems, a bulk acoustic wave resonator is provided according to a first aspect of an embodiment of the disclosure.

Figure 2:
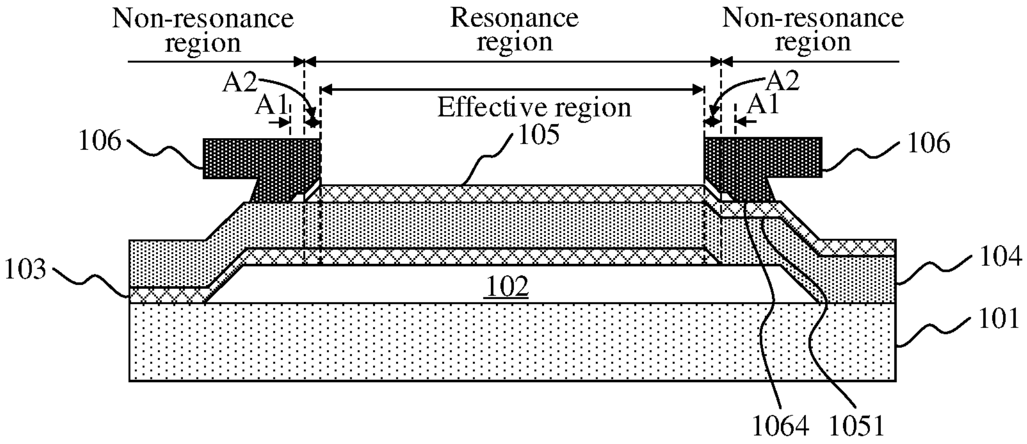
FIG. 2 is a section schematic diagram of a second bulk acoustic wave resonator according to an embodiment of the disclosure.
Figure 3:
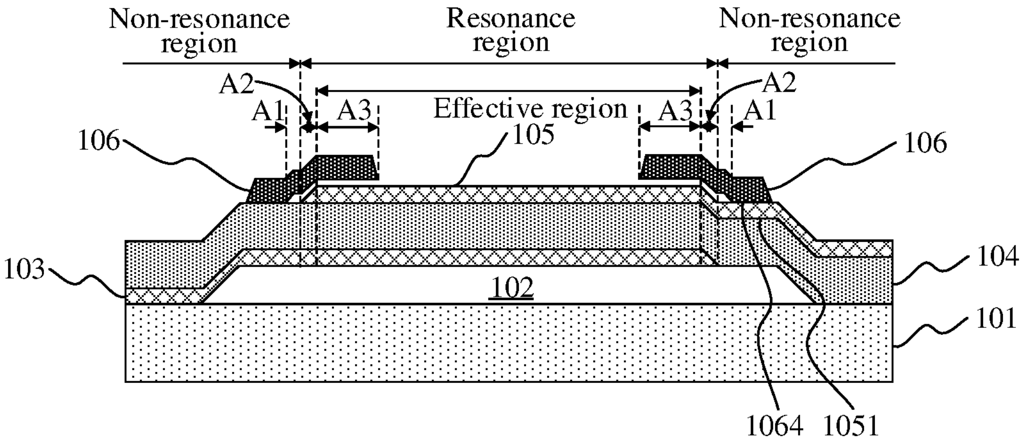
FIG. 3 is a section schematic diagram of a third bulk acoustic wave resonator according to an embodiment of the disclosure.
Figure 4:
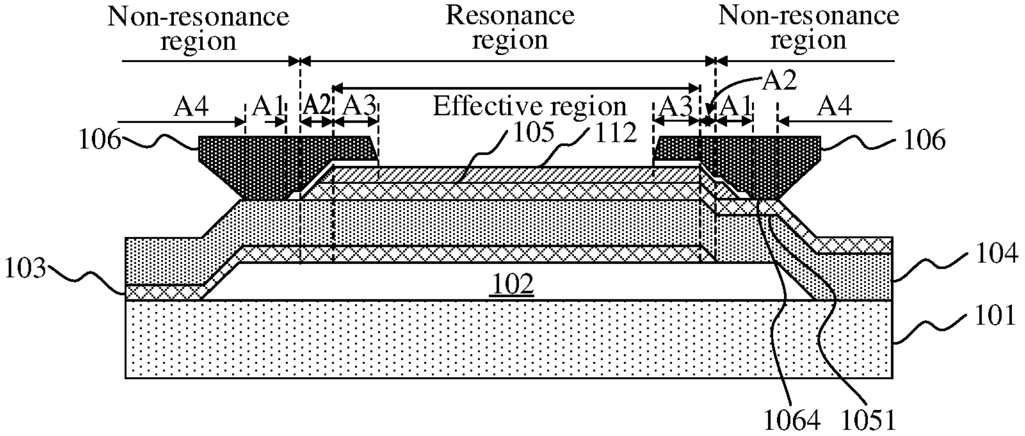
FIG. 4 is a section schematic diagram of a fourth bulk acoustic wave resonator according to an embodiment of the disclosure.
Figure 5:
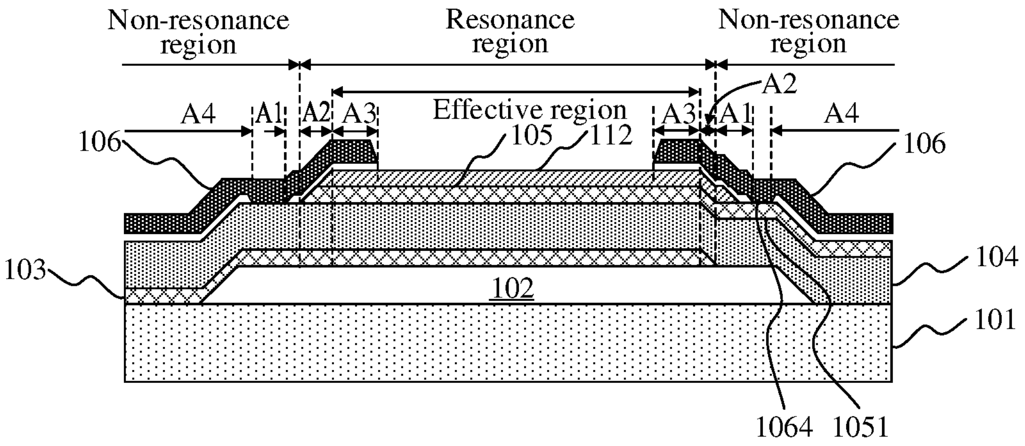
FIG. 5 is a section schematic diagram of a fifth bulk acoustic wave resonator according to an embodiment of the disclosure.

FIG. 1 is a section schematic diagram of a first bulk acoustic wave resonator according to an embodiment of the disclosure. FIG. 2 is a section schematic diagram of a second bulk acoustic wave resonator according to an embodiment of the disclosure. FIG. 3 is a section schematic diagram of a third bulk acoustic wave resonator according to an embodiment of the disclosure. FIG. 4 is a section schematic diagram of a fourth bulk acoustic wave resonator according to an embodiment of the disclosure. FIG. 5 is a section schematic diagram of a fifth bulk acoustic wave resonator according to an embodiment of the disclosure.

Referring to FIGS. 1-5, the embodiments of the disclosure provides a bulk acoustic wave resonator, including: a substrate 101; a reflective structure 102, a first electrode layer 103, a piezoelectric layer 104, and a second electrode layer 105 which are sequentially stacked on the substrate 101; and a suspended protruding block 106. The suspended protruding block 106 is located on the piezoelectric layer 104 outside an edge region and at least surrounds the edge region, with a gap structure located between the suspended protruding block 106 and the piezoelectric layer 104 in the edge region, and between the suspended protruding block 106 and the second electrode layer 105 in the edge region. The top surface of the suspended protruding block 106 is higher than the top surface of the second electrode layer 105, and the edge region includes a portion of a non-resonance region adjacent to a resonance region.

It is noted that the suspended protruding block may be a continuous solid structure surrounding all or part of the edge region, and the suspended protruding block may surround all or part of the edge region continuously. The suspended protruding block may also be an intermittent structure surrounding all or part of the edge region, and the suspended protruding block may surround all or part of the edge region intermittently.

It is to be noted that the bulk acoustic wave resonator shown in any one of FIGS. 1-5 is only one example of the embodiments of the disclosure, and is not used to limit the characteristics of the bulk acoustic wave resonator of the embodiments of the disclosure. Other examples of the bulk acoustic wave resonator of the embodiments of the disclosure are shown in the later embodiments. The arrangement of the suspended protruding block in the bulk acoustic wave resonator of any one of FIGS. 1-5 is different. The difference between the bulk acoustic wave resonator of any one of FIGS. 1-3 and the bulk acoustic wave resonator of FIG. 4 or 5 is also that the bulk acoustic wave resonator of FIG. 4 or 5 includes a frequency modulation layer 112 located on the second electrode layer 105.

In some embodiments, for understanding, the suspended protruding block in the bulk acoustic wave resonator of FIG. 4 or 5 may be replaced by the suspended protruding block in the bulk acoustic wave resonator of any one of FIGS. 1-3. Alternatively, for understanding, the suspended protruding block in the bulk acoustic wave resonator of any one of FIGS. 1-3 may be replaced by the suspended protruding block in the bulk acoustic wave resonator of FIG. 4 or 5.

In a practical application, the composition material of the substrate 101 may include silicon (Si), germanium (Ge), or the like.

The first electrode layer 103 may be referred to as a lower electrode, and correspondingly, the second electrode layer 105 may be referred to as an upper electrode. Electrical energy may be exerted to the bulk acoustic wave resonator through the upper electrode and lower electrode. The composition materials of the first electrode layer 103 and the second electrode layer 105 may be the same, and specifically may include molybdenum (Mo), silver (Ag), aluminum (Al), ruthenium (Ru), iridium (Ir), platinum (Pt), or the like.

The piezoelectric layer 104 may generate vibrations according to the inverse piezoelectric properties, and convert the electrical signals exerted on the first electrode layer 103 and the second electrode layer 105 into acoustic wave signals, thereby realizing the conversion from electrical energy to mechanical energy. In a practical application, the composition material of the piezoelectric layer 104 may include materials with piezoelectric characteristics, such as aluminum nitride (AlN), zinc oxide (ZnO), lithium tantalate ($LiTaO_3$), or the like. The composition material of the piezoelectric layer 104 may also include doped piezoelectric characteristic materials, such as scandium (Sc)-doped materials.

The reflective structure 102 is used to reflect acoustic wave signals. When an acoustic wave signal generated by the piezoelectric layer 104 propagates towards the reflective structure 102, the acoustic wave signal may be totally reflected at the interface where the first electrode layer 103 and the reflective structure 102 are in contact, causing the acoustic wave signal to be reflected back into the piezoelectric layer 104.

In a practical application, according to different forms, the reflection structure 102 may be specifically classified as a first type of cavity-type Film Bulk Acoustic Wave Resonator (FBAR), a second type of cavity-type FBAR, a Solid Mounted Resonator (SMR)-type resonator, or the like. Solutions provided by embodiments of the disclosure may apply to the above different types of bulk acoustic wave resonators.

In some embodiments, in case that the bulk acoustic wave resonator includes the first type of cavity-type FBAR, the reflective structure 102 includes a first cavity formed between the upwardly protuberant first electrode layer 103 and the surface of the substrate 101.

In some embodiments, in case that the bulk acoustic wave resonator includes the second type of cavity-type FBAR, the reflective structure 102 includes a second cavity formed between the downwardly recessed surface of the substrate and the first electrode layer 103.

In some embodiments, in case that the bulk acoustic wave resonator includes an SMR resonator, the reflective structure 102 includes multiple first dielectric layers and second dielectric layers with different acoustic impedances and arranged as stacked alternately.

It is noted that the reflective structure 102 may be a cavity or a solid structure. In case that the reflective structure 102 is a cavity, the reflective structure 102 includes a first cavity or a second cavity; and in case that the reflective structure 102 is a solid structure, the reflective structure 102 includes multiple first dielectric layers and second dielectric layers arranged as stacked alternately. Exemplarily, the reflective structure 102 is illustrated here and below as including a first cavity formed between the upwardly protuberant first electrode layer 103 and the surface of the substrate 101.

Here and below, the resonance region, which is also referred to as an active region, includes a region where the reflection structure 102, the first electrode layer 103, the piezoelectric layer 104, and the second electrode layer 105 overlap in a third direction (as the resonance region shown in any one of FIGS. 1-3). The non-resonance region is adjacent to the resonance region and includes a region located outside the resonance region in the bulk acoustic wave resonator. The resonance region includes the effective region, and a region which is adjacent to the effective region and located outside the effective region in the resonance region. Here, the third direction is a direction perpendicular to the surface of the substrate 101. It may be understood that the third direction may also be understood as the direction in which the first electrode layer 103, the reflection structure 102, the piezoelectric layer 104, and the second electrode layer 105 are stacked on the substrate 101.

The suspended protruding block 106 is located on the piezoelectric layer 104 outside an edge region and at least surrounds the edge region, with a gap structure located between the suspended protruding block 106 and the piezoelectric layer 104 in the edge region, and between the suspended protruding block 106 and the second electrode layer 105 in the edge region. The top surface of the suspended protruding block 106 is higher than the top surface of the second electrode layer 105, and the edge region includes a portion of the non-resonance region adjacent to the resonance region.

In some embodiments, the material of the suspended protruding block includes a metallic material, a dielectric material, and a piezoelectric material. Exemplarily, the material of the suspended protruding block may be a high acoustic impedance metallic material, such as Mo, Ag, Al, or the like. The material of the suspended protruding block may also be a dielectric material such as silicon oxide ($SiO_2$) or silicon nitride ($Si_3N_4$), or a piezoelectric material such as AlN.

In some embodiments, the material of the gap structure includes at least one of an air gap or a low acoustic impedance material. Exemplarily, the material of the gap structure includes an air gap, or, the material of the gap structure includes an air gap and a low acoustic impedance material.

In some embodiments, the material of the gap structure includes an air gap and a low acoustic impedance material. Here, the air gap may be located between the suspended protruding block 106 and the piezoelectric layer 104 in the edge region, or between the suspended protruding block 106 and the sidewall of the second electrode layer 105 in the edge region, or between the suspended protruding block 106 and the top surface of the second electrode layer 105 in the edge region. That is, the air gap here is located at any location in the edge region. Alternatively, the air gap here includes multiple air gap spaces separated by the material of the gap structure.

It is to be noted that the gap structure including air gaps in the bulk acoustic wave resonator shown in any one of FIGS. 1-5 is only one example of the embodiments of the disclosure, and is not used to limit the characteristics of the bulk acoustic wave resonator of the embodiments of the disclosure. Other examples of the bulk acoustic wave resonator of the embodiments of the disclosure are shown in the later embodiments.

In some embodiments, the material of the suspended protruding block includes an electrically conductive material, and the material of the gap structure includes at least one of an air gap or a low acoustic impedance material. Exemplarily, the material of the suspended protruding block may be a high acoustic impedance metallic material, Mo, and the material of the gap structure includes at least one of an air gap or $Si_3N_4$, which may reduce transverse acoustic wave loss, thereby increasing the Q value.

In some embodiments, the greater the mass of the suspended protruding block is and the smaller the force area is, the greater the acoustic impedance is, the smaller the second width L1 of the protruding block column is, and the higher the Q value is. A theoretical explanation is shown in the following equations (1)-(3).

The acoustic impedance $Z_{(acoustic)}$ of the bulk acoustic wave resonator is:

$$Z_{(acoustic)} = \frac{T}{\upsilon_{(acoustic)}} \tag{1}$$

where T represents the stress exerted on the piezoelectric layer by the suspended protruding block, and $\upsilon_{(acoustic)}$ represents the velocity of the acoustic wave.

$$F = T \times A = Z_{(acoustic)} \times \upsilon_{(acoustic)} \times A = m\alpha \tag{2}$$

where F represents the resultant force received by the suspended protruding block, A represents the force area of the suspended protruding block towards the piezoelectric layer, m represents the mass of the suspended protruding block, and α represents the gravitational acceleration.

From equations (1) and (2), it may be known that the acoustic impedance $Z_{(acoustic)}$ of the bulk acoustic wave resonator is:

$$Z_{(acoustic)} = \frac{m\alpha}{\upsilon_{(acoustic)} \times A} \tag{3}$$

From equation (3), it may be known that the greater the mass of the suspended protruding block (which may be represented by the first width W1 and the first thickness H1 of the suspended protruding block) is and the smaller the force area A is, the greater the acoustic impedance $Z_{(acoustic)}$ is, and therefore, the smaller the second width L1 of the suspended protruding block is, the greater the impedance difference of the impedance adapted interface in the transverse transmission process of the acoustic wave is, and the acoustic leakage is reduced, thereby the higher the Q value is.

Figure 24A:
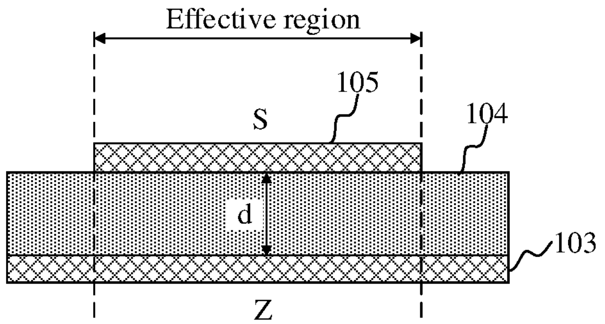
FIG. 24A is a schematic diagram of the action mechanism of an original structure of a bulk acoustic wave resonator (without a suspended protruding block)
Figure 24B:
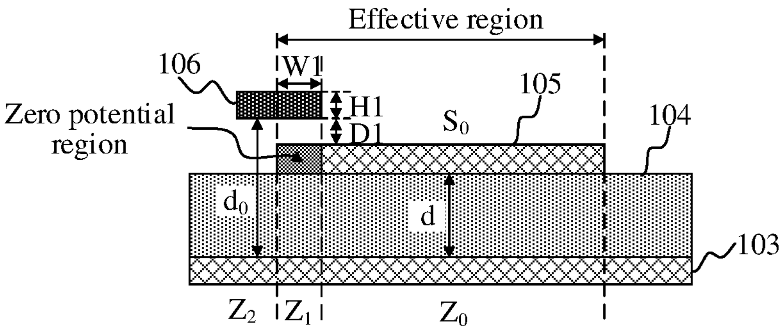
FIG. 24B is a schematic diagram of the action mechanism of a suspended protruding block of a bulk acoustic wave resonator.

FIG. 24A is a schematic diagram of the action mechanism of an original structure of a bulk acoustic wave resonator (without a suspended protruding block). FIG. 24B is a schematic diagram of the action mechanism of a suspended protruding block of a bulk acoustic wave resonator.

Referring to FIGS. 24A and 24B, the electrical impedance Z of an ideal bulk acoustic wave resonator is explained as the following equation (4).

$$Z = \frac{1}{i\omega C_0}\left(1 - Kt^2\frac{\tan\theta}{\theta}\right) \tag{4}$$

where $Kt^2$ represents the electromechanical coupling coefficient of the bulk acoustic wave resonator, i represents the imaginary unit, ω represents the angular frequency, θ represents the phase difference between the current and the voltage, and $C_0$ represents the static capacitance of the bulk acoustic wave resonator. The impedance is the largest in case of parallel resonance, and at this time the impedance $Z_P$ at the parallel resonance point is:

$$Z_P = \frac{1}{i\omega C_0} \tag{5}$$

where $C_0$ is the static capacitance of the bulk acoustic wave resonator, and the proportional relationship of $C_0$ to the relative area S and to the inter-electrode distance d is:

$$C_0 \sim \frac{S}{d} \tag{6}$$

From the above equations (5) and (6), it may be known that the impedance $Z_P$ at the parallel resonance point is proportional to the relative area S and inversely proportional to the inter-electrode distance d.

The suspended protruding block changes the overlapping part of the inner edge of the second electrode layer into an equipotential body (i.e. a zero potential region), and changes the capacitance of the inner edge region, thereby changing the longitudinal impedance $Z_1$ of the region. A cavity is created on the outer edge of the second electrode layer by the suspended protruding block, which changes the longitudinal impedance $Z_2$ of the region. The shear wave encounters two impedance mismatch interfaces during the transverse transmission process, such that the acoustic loss caused by the acoustic wave leakage is further reduced, and thereby the Q value is improved. Here, $S_0$ is the remaining area in the relative area S after removing the area where the zero potential region is located, and $Z_0$ is the longitudinal impedance of the region.

According to a theoretical explanation, a first width W1 of the suspended protruding block may be regarded as the relative area S, and the Q value theoretically increases with the increase of the first width W1. A first distance D1 between the suspended protruding block and the bulk acoustic wave resonator (e.g. a top surface of the resonance region) and a first thickness H1 of the suspended protruding block may be regarded as the increased distance between the electrodes (i.e. the difference between a distance do and a distance d, here $d_0$ is the distance between the suspended protruding block and the first electrode layer, and d is the inter-electrode distance (i.e. the distance between the first electrode layer and second electrode layer)), and the Q value theoretically increases with the increase of the first distance D1.

Referring to FIGS. 1 and 2, in some embodiments, the resonance region includes the effective region and a second region A2 located between the effective region and the non-resonance region, and a portion of the non-resonance region adjacent to the second region is a first region A1.

The suspended protruding block 106 surrounds the first region A1, or the suspended protruding block 106 surrounds the first region A1 and the second region A2, with a gap structure located between the suspended protruding block 106 and the piezoelectric layer 104 in the first region A1, and between the suspended protruding block 106 and the sidewall of the second electrode layer 105 in the second region A2.

As shown in FIG. 1, the first region A1 constitutes the edge region. The suspended protruding block 106 surrounds the first region A1, with a gap structure located between the suspended protruding block 106 and the piezoelectric layer 104 in the first region A1, and between the suspended protruding block 106 and the sidewall of the second electrode layer 105 in the first region A1.

As shown in FIG. 2, the first region A1 and the second region A2 constitute the edge region. The suspended protruding block 106 surrounds the first region A1 and the second region A2, with a gap structure located between the suspended protruding block 106 and the piezoelectric layer 104 in the first region A1, and between the suspended protruding block 106 and the sidewall of the second electrode layer 105 in the second region A2.

In this way, a gap structure (including a cavity) which surrounds the outer edge of the second electrode layer is created on the outer edge of the second electrode layer by the suspended protruding block, such that the longitudinal impedance of the gap structure region is changed and the global quality factor Q value of the acoustic wave device may be improved.

Referring to FIG. 3, in some embodiments, the resonance region includes the effective region and the second region A2 located between the effective region and the non-resonance region. A third region A3 includes a portion of the effective region adjacent to the second region. The first region A1, the second region A2, and the third region A3 constitute the edge region.

The suspended protruding block 106 surrounds the edge region, with a gap structure located between the suspended protruding block 106 and the piezoelectric layer 104 in the edge region, between the suspended protruding block 106 and the sidewall of the second electrode layer 105 in the edge region, and between the suspended protruding block 106 and the top surface of the second electrode layer 105 in the edge region.

In this way, a gap structure (including a cavity) which surrounds the outer edge of the second electrode layer is created on the outer edge of the second electrode layer by the suspended protruding block, such that the longitudinal impedance of the gap structure region is changed. The suspended protruding block at the inner edge of the second electrode layer is directly introduced into the resonance region to change the inner edge of the second electrode layer into an equipotential body, such that the capacitance of the inner edge region is changed and thereby the longitudinal impedance of the inner edge region is changed. With this structure, an acoustic wave may encounter two impedance mismatch interfaces during the transverse transmission process, such that the acoustic loss caused by the acoustic wave leakage is further reduced, and the global quality factor Q value of the acoustic wave device may be improved.

Referring to FIGS. 4 and 5, in some embodiments, the suspended protruding block 106 further includes an extension part. The extension part surrounds a fourth region A4, with a gap structure located between the extension part and the piezoelectric layer 104 in the fourth region A4, and between the extension part and a lead wire 1051 of the second electrode layer 105 in the fourth region A4. The fourth region A4 includes a portion of the non-resonance region located outside the contact region between the suspended protruding block 106 and the piezoelectric layer 104.

In some embodiments, the extension part extends in the direction of the width and height of the suspended protruding block, and/or, the extension part extends along the top surface of the piezoelectric layer.

As shown in FIG. 4, the extension part of the suspended protruding block 106 surrounds the fourth region A4, with a gap structure located between the extension part and the piezoelectric layer 104 in the fourth region A4, and between the extension part and the lead wire of the second electrode layer 105 in the fourth region A4. Furthermore, the extension part of the suspended protruding block 106 extends in the direction of the width and height of the suspended protruding block 106.

As shown in FIG. 5, the extension part of the suspended protruding block 106 surrounds the fourth region A4, with a gap structure located between the extension part and the piezoelectric layer 104 in the fourth region A4, and between the extension part and the lead wire of the second electrode layer 105 in the fourth region A4. Furthermore, the extension part of the suspended protruding block 106 extends along the top surface of the piezoelectric layer 104.

In this way, on one hand, on the piezoelectric layer in the non-resonance region, a gap structure (including a cavity) which surrounds the outer edge of the second electrode layer is created on the outer edge of the second electrode layer by the suspended protruding block, such that the longitudinal impedance of the gap structure region is changed. On the other hand, the suspended protruding block includes an extension part, such that the greater the mass of the suspended protruding block, the greater the longitudinal acoustic impedance is due to the mass-loading effect. Therefore, the acoustic loss caused by the acoustic wave leakage is further reduced, and the global quality factor Q value of the acoustic wave device may be improved.

Figure 6:
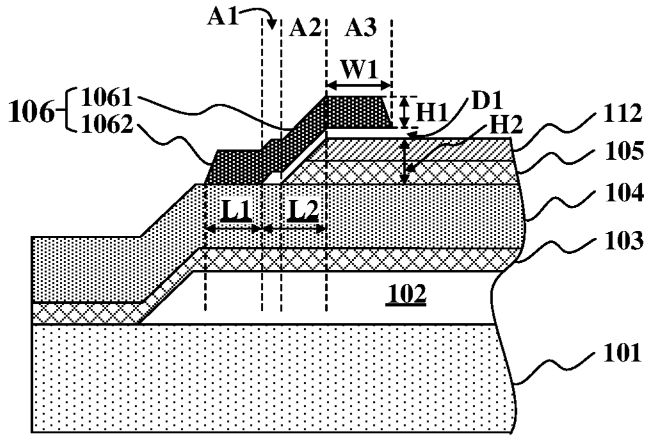
FIG. 6 is a partial section schematic diagram of a sixth bulk acoustic wave resonator according to an embodiment of the disclosure.

FIG. 6 is a partial section schematic diagram of a sixth bulk acoustic wave resonator according to an embodiment of the disclosure.

It is to be noted that FIG. 6 may also be understood as a partial section schematic diagram of the bulk acoustic wave resonator of any one of FIGS. 1-5. The difference between the bulk acoustic wave resonator of FIG. 6 and the bulk acoustic wave resonator of any one of FIGS. 1-3 is that the bulk acoustic wave resonator of FIG. 6 includes a frequency modulation layer 112 located on the second electrode layer 105. The arrangement of the suspended protruding block in the bulk acoustic wave resonator of FIG. 6 is different from the suspended protruding block of the bulk acoustic wave resonator of FIG. 4 or 5.

Referring to FIG. 6, in some embodiments, the ratio of the thickness of the suspended protruding block 106 located in the third region A3 (i.e. a first thickness H1) to the thickness of the second electrode layer 105 (i.e. a second thickness H2) ranges from 1 to 50. It is to be noted that here and below, in case that the frequency modulation layer 112 is present on the second electrode layer 105, the second thickness H2 here may be understood as the sum of the thickness of the second electrode layer 105 and the thickness of the frequency modulation layer 112. In case that the frequency modulation layer is not present on the second electrode layer 105, the second thickness H2 here may be understood as the thickness of the second electrode layer 105, which may be understood with reference to FIG. 3.

In some embodiments, the suspended protruding block 106 located in the third region A3 has a first thickness H1 and a first width W1. The first thickness H1 ranges from 0.5 μm to 5 μm, and the first width W1 ranges from 1 μm to 10 μm.

In some embodiments, the suspended protruding block 106 located in the third region A3 has a first distance D1 from the top surface of the resonance region. The ratio of the first distance D1 to the thickness of the second electrode layer (i.e. the second thickness H2) ranges from 1 to 15.

In some embodiments, the suspended protruding block 106 located in the third region A3 has a first distance from the edge of the resonance region. The first distance ranges from 0.5 μm to 1.5 μm.

Figure 7:
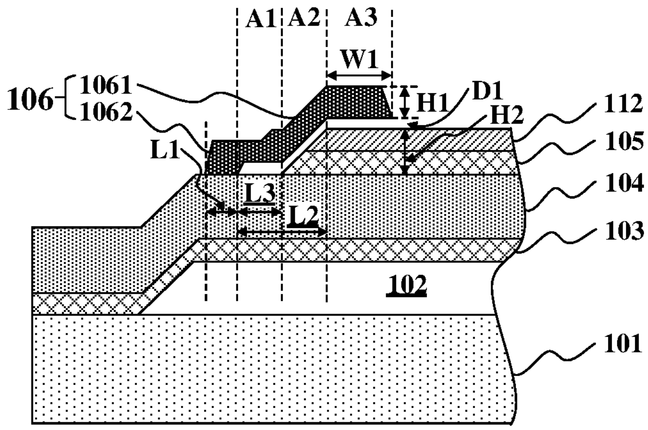
FIG. 7 is a partial section schematic diagram of a seventh bulk acoustic wave resonator according to an embodiment of the disclosure.

FIG. 7 is a partial section schematic diagram of a seventh bulk acoustic wave resonator according to an embodiment of the disclosure.

The difference between the bulk acoustic wave resonator of FIG. 7 and the bulk acoustic wave resonator of FIG. 6 is that: for the bulk acoustic wave resonator of FIG. 7, the width of the contact part between the suspended protruding block 106 and the piezoelectric layer 104 is less than the width of the non-contact part between the suspended protruding block 106 and the piezoelectric layer 104.

Referring to FIG. 7, in some embodiments, the width of the contact part between the suspended protruding block 106 and the piezoelectric layer 104 is less than the width of the non-contact part between the suspended protruding block 106 and the piezoelectric layer 104.

Referring to FIG. 7 and FIG. 1, in case that the first region A1 constitutes the edge region, the width of the contact part between the suspended protruding block 106 and the piezoelectric layer 104 is a second width L1, the width of the non-contact part between the suspended protruding block 106 and the piezoelectric layer 104 is a third distance L3, and the second width L1 is less than the third distance L3.

Referring to FIG. 7 and FIG. 2, in case that the first region A1 and the second region A2 constitute the edge region, the width of the contact part between the suspended protruding block 106 and the piezoelectric layer 104 is the second width L1, the width of the non-contact part between the suspended protruding block 106 and the piezoelectric layer 104 is a second distance L2, and the second width L1 is less than the second distance L2.

Referring to FIG. 7 and FIG. 3, in case that the first region A1, the second region A2 and the third region A3 constitute the edge region, the width of the contact part between the suspended protruding block 106 and the piezoelectric layer 104 is the second width L1, the width of the non-contact part between the suspended protruding block 106 and the piezoelectric layer 104 is the sum of the second distance L2 and the first width W1, and the second width L1 is less than the sum of the second distance L2 and the first width W1, that is, L1<(L2+W1).

In this way, the smaller the second width L1 of the suspended protruding block is, the greater the acoustic impedance $Z_{(acoustic)}$ is and the higher the Q value is. The specific analysis may be referred to the illustration of above Equations. (1)-(3).

Figure 8:
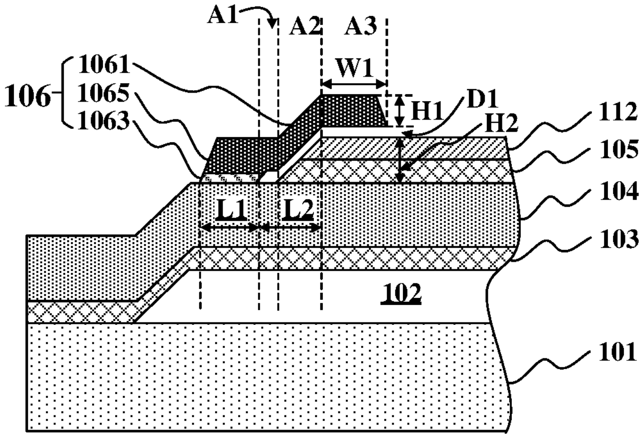
FIG. 8 is a partial section schematic diagram of an eighth bulk acoustic wave resonator according to an embodiment of the disclosure.

FIG. 8 is a partial section schematic diagram of an eighth bulk acoustic wave resonator according to an embodiment of the disclosure.

The difference between the bulk acoustic wave resonator of FIG. 8 and the bulk acoustic wave resonator of FIG. 6 is that the material of the contact part between the suspended protruding block 106 and the piezoelectric layer 104 of the bulk acoustic wave resonator of FIG. 8 is different from the material of the contact part between the suspended protruding block 106 and the piezoelectric layer 104 of the bulk acoustic wave resonator of FIG. 6.

In some embodiments, referring to FIG. 6, the suspended protruding block 106 includes a first protruding block column 1062 which extends to a portion of the piezoelectric layer 104 located outside the edge region. The material of the first protruding block column 1062 includes at least one of an electrically conductive material or an insulating material.

Alternatively, referring to FIG. 8, the suspended protruding block includes a second protruding block column 1065 which extends to a pad. The pad 1063 is located on a portion of the piezoelectric layer located outside the edge region, and the second protruding block column 1065 is electrically isolated from the piezoelectric layer 104 by the pad 1063. The material of the second protruding block column 1065 includes an electrically conductive material, and the material of the pad 1063 includes at least one of a low acoustic impedance material or an insulating material.

As shown in FIG. 6, the suspended protruding block 106 includes the first protruding block column 1062 located outside the first region A1 and in contact with a portion of the piezoelectric layer 104, and a separation part 1061 located in the first region A1, the second region A2, and the third region A3 and separated from a portion of the piezoelectric layer 104. The material of the first protruding block column 1062 and the separation part 1061 includes at least one of a conductive material or an insulating material. Exemplarily, the material of the first protruding block column is a metal conductive material such as Mo, Ag, Al, or the like.

As shown in FIG. 8, the suspended protruding block 106 includes the first protruding block column 1062 located outside the first region A1 and in contact with a portion of the piezoelectric layer 104 by the pad 1063, and a separation part 1061 located in the first region A1, the second region A2, and the third region A3 and separated from a portion of the piezoelectric layer 104. Here, the first protruding block column 1062 is electrically isolated from the piezoelectric layer 104. Exemplarily, the material of the first protruding block column 1062 and the separation part 1061 is a metal conductive material, such as Mo, Ag, or Al. The material of the pad is an insulating material, such as $SiO_2$ or $Si_3N_4$.

In this way, with this structure, the acoustic loss caused by the acoustic wave leakage may be reduced, and the global quality factor Q value of the acoustic wave device may be improved.

In some embodiments, the first protruding block column 1062 or the pad 1063 has a second width L1, and the second width L1 ranges from 1 μm to 3 μm.

In some embodiments, the first protruding block column 1062 or the pad 1063 has a second distance L2 from the edge of the resonance region, and the second distance L2 ranges from 1 μm to 3 μm.

Figure 9:
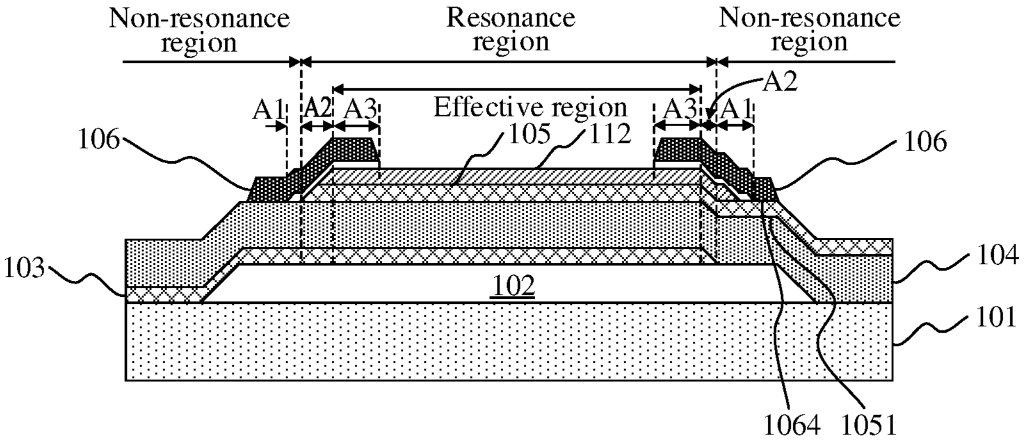
FIG. 9 is a section schematic diagram of a ninth bulk acoustic wave resonator according to an embodiment of the disclosure.
Figure 10:
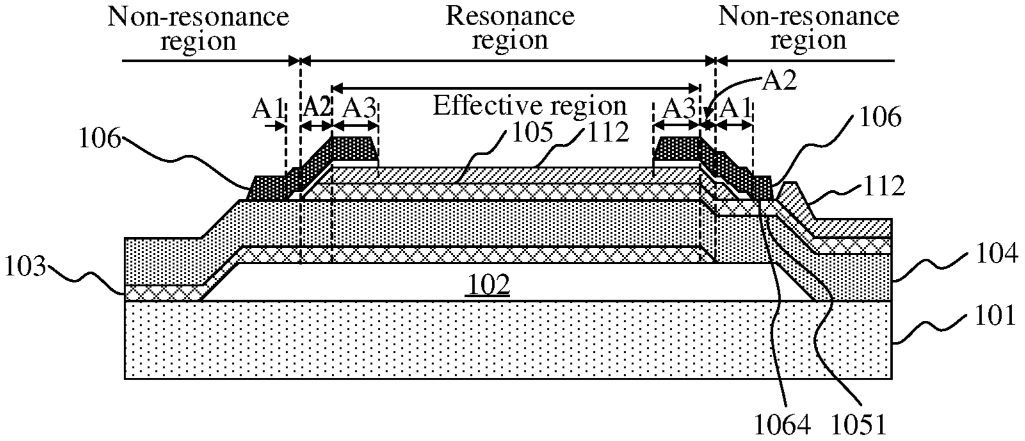
FIG. 10 is a section schematic diagram of a tenth bulk acoustic wave resonator according to an embodiment of the disclosure.

FIG. 9 is a section schematic diagram of a ninth bulk acoustic wave resonator according to an embodiment of the disclosure. FIG. 10 is a section schematic diagram of a tenth bulk acoustic wave resonator according to an embodiment of the disclosure. The difference between the bulk acoustic wave resonator of FIG. 9 or 10 and the bulk acoustic wave resonator of FIG. 3 is that the bulk acoustic wave resonator of FIG. 9 or 10 includes a frequency modulation layer 112 located on the second electrode layer 105. It is to be noted that FIG. 6 may also be understood as a partial section schematic diagram of the bulk acoustic wave resonator of FIG. 9 or 10.

In some embodiments, the suspended protruding block 106 is in contact with the lead wire 1051 of the second electrode layer 105 or the suspended protruding block 106 is not in contact with the lead wire 1051 of the second electrode layer 105.

Exemplarily, referring to FIGS. 9 and 10, the suspended protruding block 106 is in contact with the lead wire 1051 of the second electrode layer 105.

Referring to FIGS. 9 and 10, in some embodiments, the suspended protruding block 106 includes a connection part 1064 which extends to the lead wire 1051 of the second electrode layer 105 outside the edge region. The connection part 1064 is in contact with and electrically connected to the lead wire 1051 of the second electrode layer.

Here, the suspended protruding block 106 is in contact with and electrically connected to the lead wire 1051 of the second electrode layer by the connection part 1064, such that a capacitance is introduced into the effective region, and the capacitance which is introduced into the effective region is electrically in-phase with the resonator. Therefore, no additional parasitic resonance is introduced.

In some embodiments, the resonator further includes an frequency modulation layer 112. The suspended protruding block 106 includes the connection part 1064 which extends to the lead wire 1051 of the second electrode layer 105 outside the edge region.

Referring to FIG. 9, the frequency modulation layer 112 covers the second electrode layer 105, the connection part 1064 is in contact with and electrically connected to the lead wire 1051 of the second electrode layer. At this time, the frequency modulation layer 112 partially covers (i.e., does not completely cover) the lead wire 1051 of the second electrode layer, or the frequency modulation layer 112 does not cover the lead wire 1051 of the second electrode layer.

Alternatively, referring to FIG. 10, the frequency modulation layer 112 covers the second electrode layer 105 and the lead wire 1051 of the second electrode layer. The connection part 1064 penetrates the frequency modulation layer 112 such that the connection part 1064 is in contact with and electrically connected to the lead wire 1051 of the second electrode layer.

Referring to FIGS. 9 and 6, in some embodiments, the suspended protruding block 106 located in the resonance region has a first thickness H1. The ratio of the first thickness H1 to the sum of the thickness of the second electrode layer 105 and the thickness of the frequency modulation layer 112 (i.e. the second thickness H2) ranges from 0.5 to 5.

In some embodiments, the sum of the thickness of the second electrode layer 105 and the thickness of the frequency modulation layer 112 (i.e. the second thickness H2) is less than or equal to 1 μm.

Referring to FIGS. 9 and 10, in some embodiments, the second electrode layer 105 has a inclined side.

Figure 23A:
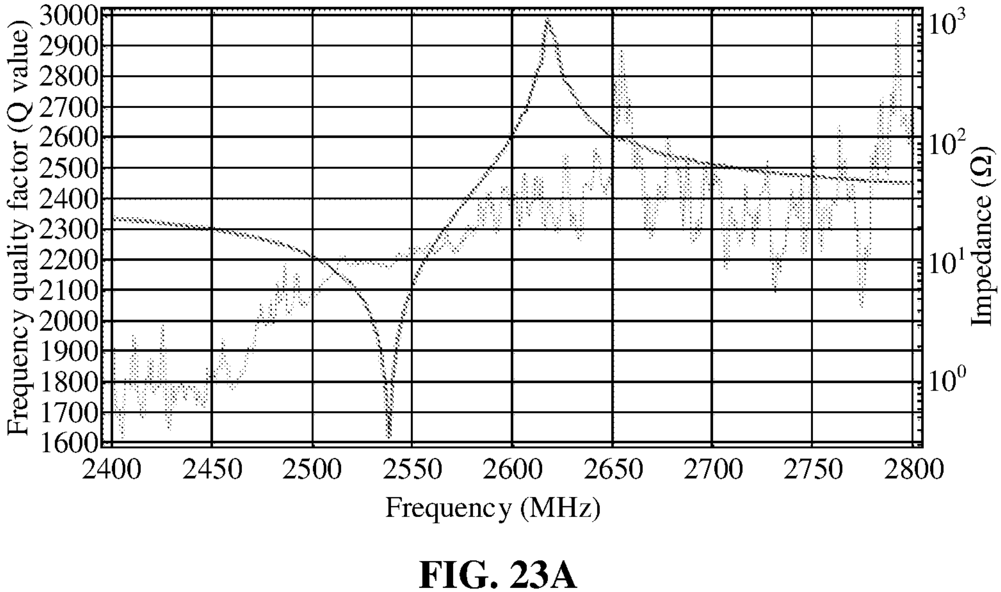
FIGS. 23A and 23B are schematic diagrams of test results of a parameter control group of a bulk acoustic wave resonator (with a suspended protruding block)
Figure 23B:
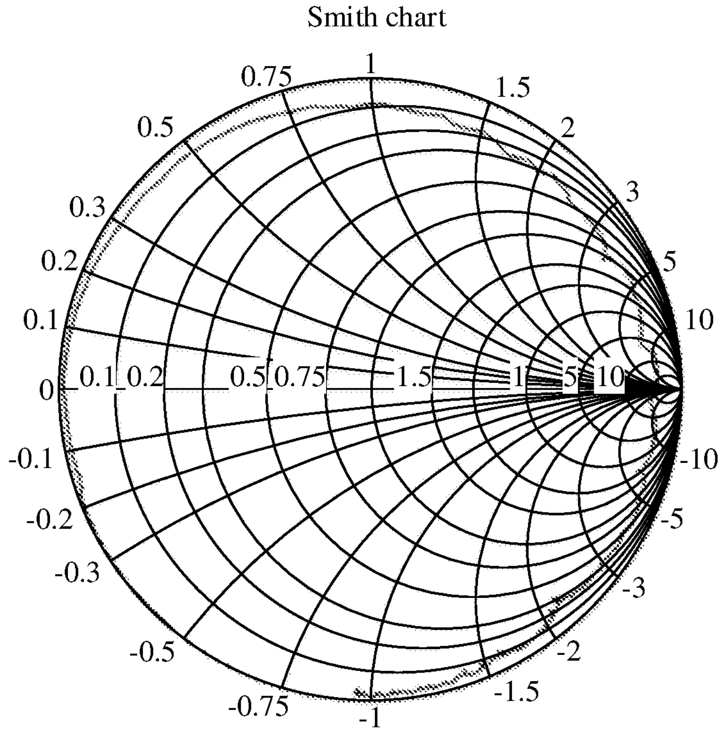

In FIGS. 23A and 23B and Tables 1 to 4, the test results of the original structure, the parameter control group, and the preferred parameter group of a specific bulk acoustic wave resonator will be illustrated in detail.

It is to be noted that the bulk acoustic wave resonator of FIG. 23A or 23B may be understood with reference to FIG. 8. Here, the preferred parameters of the suspended protruding block in the bulk acoustic wave resonator of any one of FIG. 23A or 23B, or Tables 2 to 4, is different. The bulk acoustic wave resonator of FIG. 22A or FIG. 22B may be understood with reference to the bulk acoustic wave resonator shown in FIGS. 23A and 23B with the removal of the suspended protruding block.

Figure 22A:
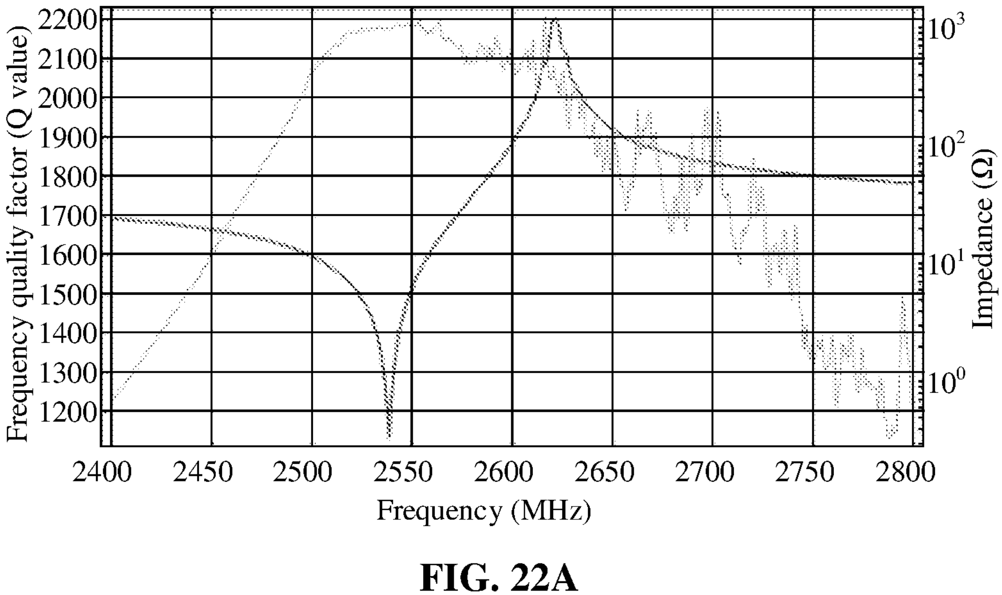
FIGS. 22A and 22B are schematic diagrams of test results of an original structure of a bulk acoustic wave resonator (without a suspended protruding block)
Figure 22B:
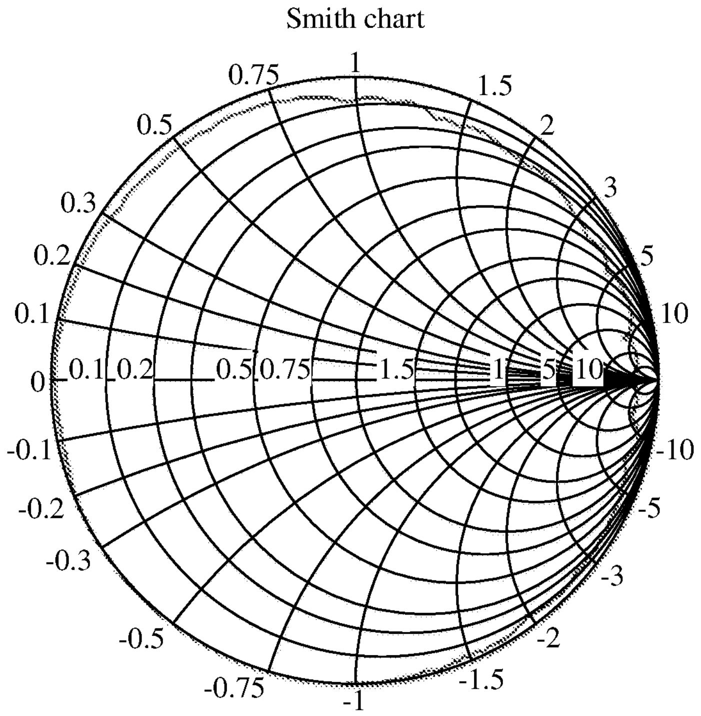

FIG. 22A shows test results of the frequency quality factor (Q value) and impedance (Ω) of an original structure of a bulk acoustic wave resonator (without a suspended protruding block). FIG. 22B shows a Smith chart of the original structure of the bulk acoustic wave resonator (without the suspended protruding block). Here, the unit of frequency is megahertz (MHz).

FIG. 23A shows test results of the frequency quality factor (Q value) and impedance (Ω) of a parameter control group of a bulk acoustic wave resonator (with a suspended protruding block). FIG. 23B shows a Smith chart of the parameter control group of the bulk acoustic wave resonator (with the suspended protruding block). Here, the unit of frequency is megahertz (MHz).

Table 1 shows a comparison of the Q values of the original structure and the parameter control group.

Here and below, the fixed resonance area of the bulk acoustic wave resonator of the original structure as well as of the parameter control group is 20,000 $\mu m^2$. The suspended protruding block of the parameter control group has a first width W1=1 μm, a first thickness H1=1.5 μm, and a first distance D1=0.5 μm. The Qs value and Qp value of the original structure may be used as a control group in the following embodiment.

As shown in FIGS. 22A and 22B, FIGS. 23A and 23B, and Table 1, the Qs value and Qp value of the original structure are 2176 and 2045 respectively, and the Qs value and Qp value of the parameter control group are 2180 and 2267 respectively. It may be seen that the introduction of the suspended protruding block may effectively increase the Q value (Qp) of the parallel resonance point. Based on this, preferably, the suspended protruding block is introduced into the bulk acoustic wave resonator, such that the Q value may be effectively improved.

TABLE 1

| | original structure | parameter control group |
|---|---|---|
| Qs | 2176 | 2180 |
| Qp | 2045 | 2267 |

Table 2 shows a comparison of the Q values of the original structure, the parameter control group, and the first preferred parameter group (including six first preferred parameters), in order to investigate the influence of the first width W1, the first thickness H1, and the first distance D1 of the suspended protruding block on the performance of the bulk acoustic wave resonator.

As shown in Table 2, the greater the first width W1 of the suspended protruding block is, the higher the Q value is, and there is no significant deterioration in the loss. In case that the distance D from the suspended protruding block to the resonator is relatively small, the first distance D1 of the suspended protruding block does not show a linear relationship with the Q value, and the smaller the first distance D1 is, the greater the loss is. The greater the first thickness H1 of the suspended protruding block is, the higher the Q value is, and there is no significant deterioration in the loss. Based on this, preferably, the suspended protruding block has the first width W1=5 μm, the first thickness H1=3 μm, and the first distance D1=2 μm, such that the Q value may be effectively improved.

TABLE 2

| | original structure | parameter control group W1 = 1 μm H1 = 1.5 μm D1 = 0.5 μm | first preferred parameter group W1 = 2 μm H1 = 1.5 μm D1 = 0.5 μm | W1 = 5 μm H1 = 1.5 μm D1 = 0.5 μm | W1 = 1 μm H1 = 1.5 μm D1 = 0.1 μm | W1 = 1 μm H1 = 1.5 μm D1 = 2 μm | W1 = 1 μm H1 = 0.5 μm D1 = 0.5 μm | W1 = 1 μm H1 = 3 μm D1 = 0.5 μm |
|---|---|---|---|---|---|---|---|---|
| Qs | 2176 | 2180 | 2180 | 2184 | 2179 | 2181 | 2176 | 2180 |
| Qp | 2045 | 2267 | 2301 | 2585 | 2567 | 2518 | 2170 | 2525 |

Table 3 shows a comparison of the Q values of the original structure, the parameter control group (W1=5 μm, H1=3 μm, and D1=2 μm), and the second preferred parameter group (including three second preferred parameters). Here, the optimal value of each parameter in the first preferred parameter group of Table 2 is taken as a parameter control group of the second preferred parameter group, that is, as the parameter control group of the second preferred parameter group, the suspended protruding block has the first width W1=5 μm, the first thickness H1=3 μm, and the first distance D1=2 μm, in order to investigate the influence of the first width W1, the first thickness H1, and the first distance D1 of the suspended protruding block on the performance of the bulk acoustic resonator.

As shown in Table 3, the greater the first width W1 of the suspended protruding block is, the higher the Q value is, and there is no significant deterioration in the loss. In case that the distance D from the suspended protruding block to the resonator is relatively large, the greater the first distance D1 of the suspended protruding block is, the higher the Q value is, and there is no significant deterioration in the loss. The greater the first thickness H1 of the suspended protruding block is, the higher the Q value is, and there is no significant deterioration in the loss. Compared with the test results of the first preferred parameter group, the test results of the second preferred parameter group show a further increase in the Q value.

TABLE 3

| | original structure | parameter control group W1 = 5 μm H1 = 3 μm D1 = 2 μm | second preferred parameter group W1 = 10 μm H1 = 3 μm D1 = 2 μm | W1 = 5 μm H1 = 6 μm D1 = 2 μm | W1 = 5 μm H1 = 3 μm D1 = 4 μm |
|---|---|---|---|---|---|
| Qs | 2176 | 2185 | 2186 | 2201 | 2174 |
| Qp | 2045 | 2736 | 2833 | 3666 | 3102 |

Table 4 shows a comparison of the Q values of the original structure, the parameter control group (L1=1 μm and L2=1 μm), and the third preferred parameter group (including six third preferred parameters).

Here and below, the suspended protruding block of the bulk acoustic wave resonator of the original structure as well as of the parameter control group has a first width W1=5 μm, a first thickness H1=3 μm, and a first distance D1=2 μm. As the parameter control group of the third preferred parameter group, the suspended protruding block has a second width L1=1 μm and a second distance L2=1 μm, in order to investigate the influence of the second width L1 of the suspended protruding block and the second distance L2 from the suspended protruding block to the resonator (or the effective resonance region) on the performance of the bulk acoustic wave resonator.

As shown in Table 4, the greater the second distance L2 from the suspended protruding block column to the resonator (or the effective resonance region), the lower the Q value is and the smaller the loss is. The greater the second width L1 of the suspended protruding block, the lower the Q value is and the greater the loss is.

TABLE 4

| | original structure | parameter control group L1 = 1 μm L2 = 1 μm | third preferred parameter group L1 = 1 μm L2 = 3 μm | L1 = 1 μm L2 = 5 μm | L1 = 1 μm L2 = 7 μm | L1 = 3 μm L2 = 1 μm | L1 = 5 μm L2 = 1 μm | L1 = 7 μm L2 = 1 μm |
|---|---|---|---|---|---|---|---|---|
| Qs | 2176 | 2185 | 2181 | 2182 | 2180 | 2183 | 2188 | 2184 |
| Qp | 2045 | 2736 | 2677 | 2560 | 2442 | 2464 | 2335 | 2389 |

The influence law of the effectiveness and parameter changes of the suspended protruding block on the performance is proposed based on the above theoretical explanations and test results. The preferred parameters of the suspended protruding block are shown exemplarily as follows.

The first thickness H1 of the suspended protruding block ranges from 0.5 μm to 5 μm, the first width W1 of the suspended protruding block ranges from 1 μm to 10 μm, the first distance D1 of the suspended protruding block ranges from 0.5 μm to 1.5 μm, the second width L1 of the suspended protruding block ranges from 1 μm to 3 μm, and the second distance L2 of the suspended protruding block ranges from 1 μm to 3 μm.

In the embodiments of the disclosure, appropriate resonator structure is set according to the connection manner of the multiple resonator circuits in the acoustic wave device. On one hand, on the piezoelectric layer in the non-resonance region, a gap structure (including a cavity) which surrounds the outer edge of the second electrode layer is created on the outer edge of the second electrode layer by the suspended protruding block, such that the longitudinal impedance of the gap structure region is changed. On the other hand, the greater the mass of the suspended protruding block, the smaller the area of the overlapping part of the suspended protruding block with the piezoelectric layer in the non-resonance region, and the greater the longitudinal acoustic impedance is due to the mass-loading effect. With this structure, an acoustic wave may encounter two impedance mismatch interfaces during the transverse transmission process, such that the acoustic loss caused by the acoustic wave leakage is further reduced, and the global quality factor Q value of the acoustic wave device may be improved.

Figure 11:
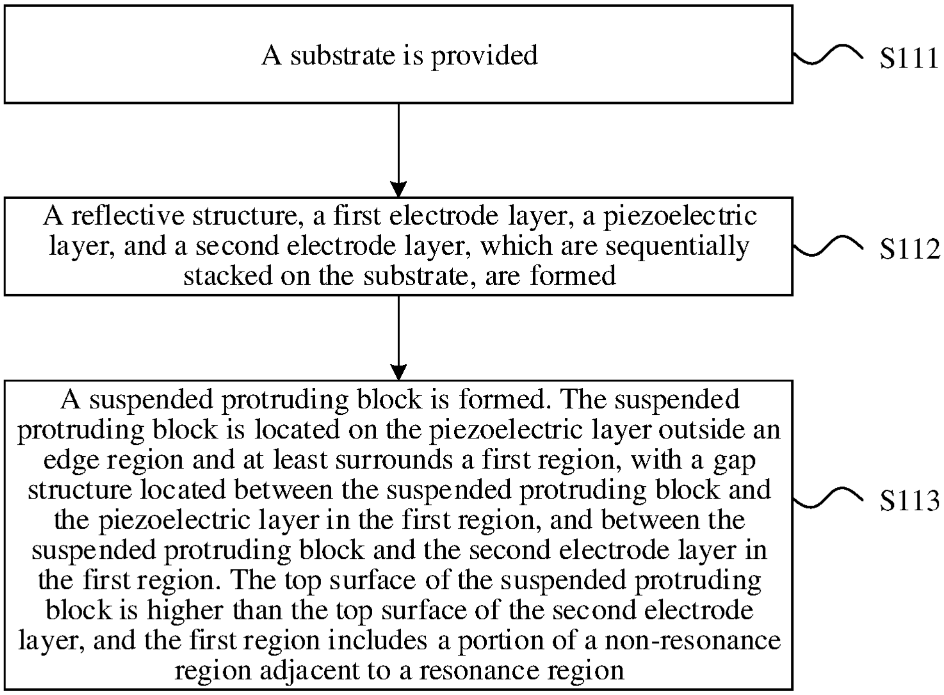
FIG. 11 is a flowchart of a manufacturing method of a bulk acoustic wave resonator according to an embodiment of the disclosure.

FIG. 11 is an implementation process schematic diagram of a manufacturing method of a bulk acoustic wave resonator according to an embodiment of the disclosure. Referring to FIG. 11, a second aspect of an embodiment of the disclosure provides a manufacturing method of a bulk acoustic wave resonator, including the following operations.

In operation S111, a substrate is provided.

In operation S112, a reflective structure, a first electrode layer, a piezoelectric layer, and a second electrode layer, which are sequentially stacked on the substrate, are formed.

In operation S113, a suspended protruding block is formed. The suspended protruding block is located on the piezoelectric layer outside an edge region and at least surrounds a first region, with a gap structure located between the suspended protruding block and the piezoelectric layer in the first region, and between the suspended protruding block and the second electrode layer in the first region. The top surface of the suspended protruding block is higher than the top surface of the second electrode layer, and the first region includes a portion of a non-resonance region adjacent to a resonance region.

Figure 12:
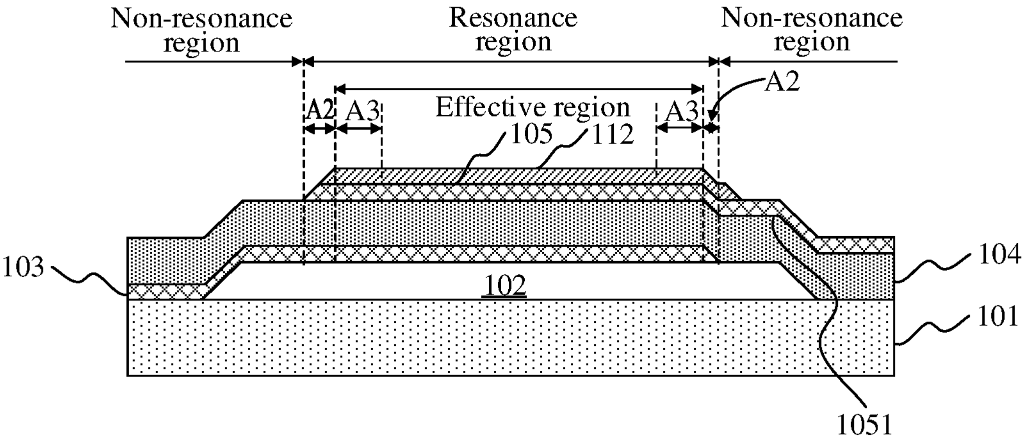
FIGS. 12-15 are section schematic diagrams of the process of a manufacturing method of a first bulk acoustic wave resonator according to an embodiment of the disclosure.

Referring to FIG. 12, the reflective structure 102 includes a first cavity formed between the upwardly protuberant first electrode layer 103 and the surface of the substrate 101. Here and below, the cavity-type reflection structure 102 is illustrated as an example.

The operations S111-S112 are performed with reference to FIG. 12. The manufacturing method of the substrate 101, the reflective structure 102, the first electrode layer 103, the piezoelectric layer 104, and the second electrode layer 105 is relatively mature in the related art, and is only briefly illustrated here. The formation method of the suspended protruding block 106 on the piezoelectric layer is emphatically illustrated. Here, the composition materials of the substrate 101, the reflective structure 102, the first electrode layer 103, the piezoelectric layer 104, and the second electrode layer 105 may be referred to the relevant description of the above FIGS. 1-5, and will not be repeated here.

Figure 16:
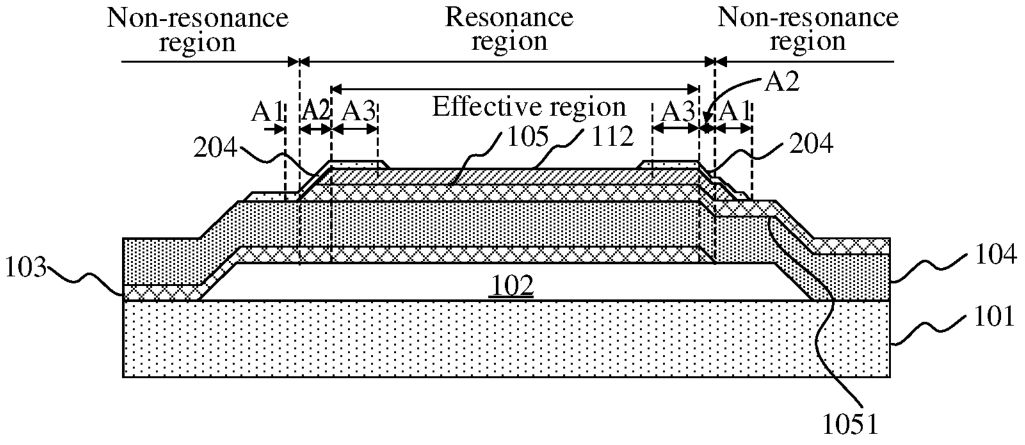
FIGS. 16-18 are section schematic diagrams of the process of a manufacturing method of a second bulk acoustic wave resonator according to an embodiment of the disclosure.
Figure 17:
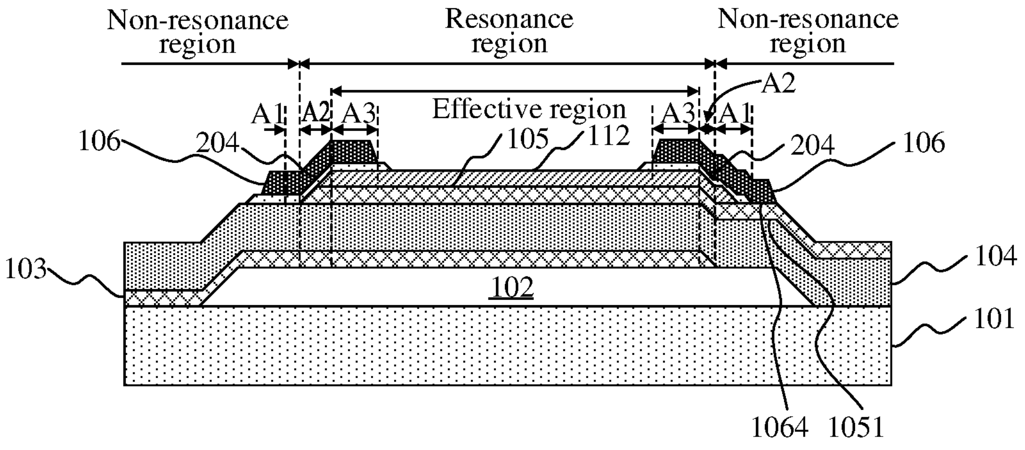
Figure 18:
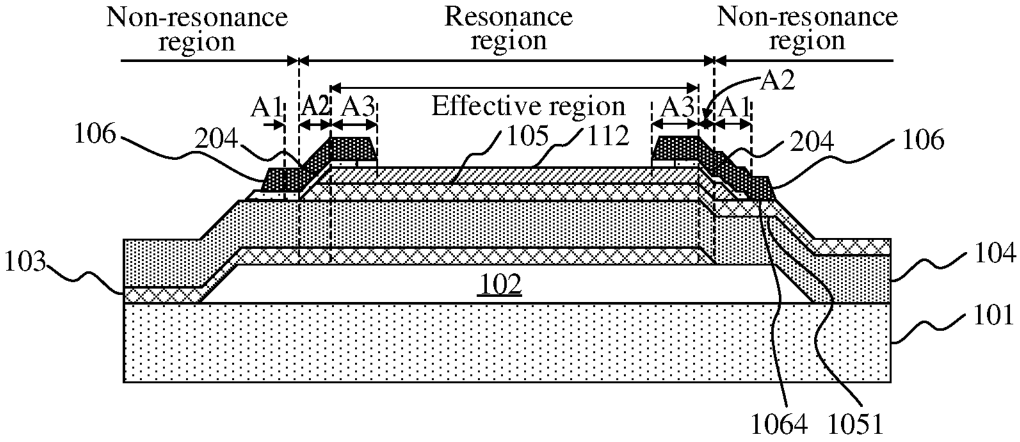
Figure 19:
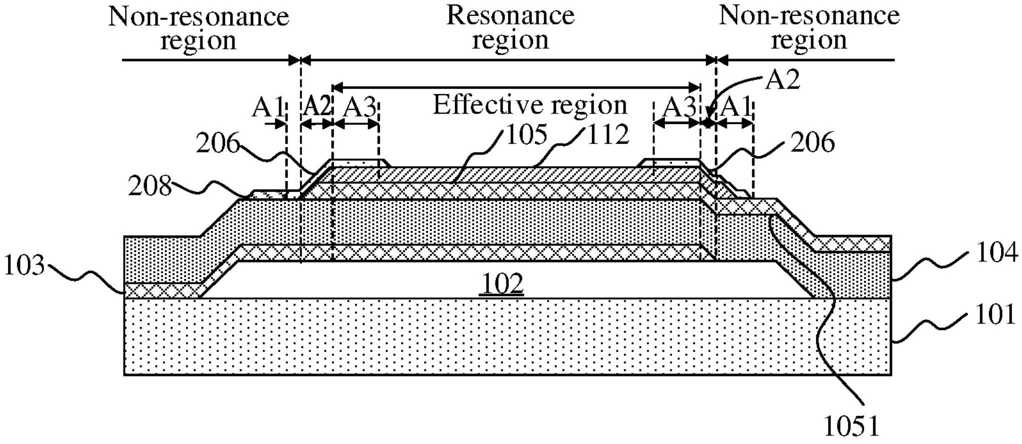
FIGS. 19-21 are section schematic diagrams of the process of a manufacturing method of a third bulk acoustic wave resonator according to an embodiment of the disclosure.
Figure 20:
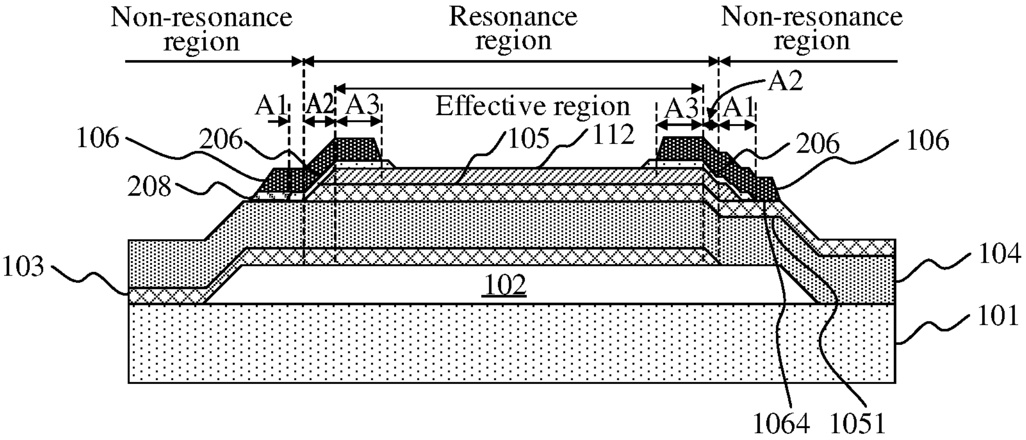
Figure 21:
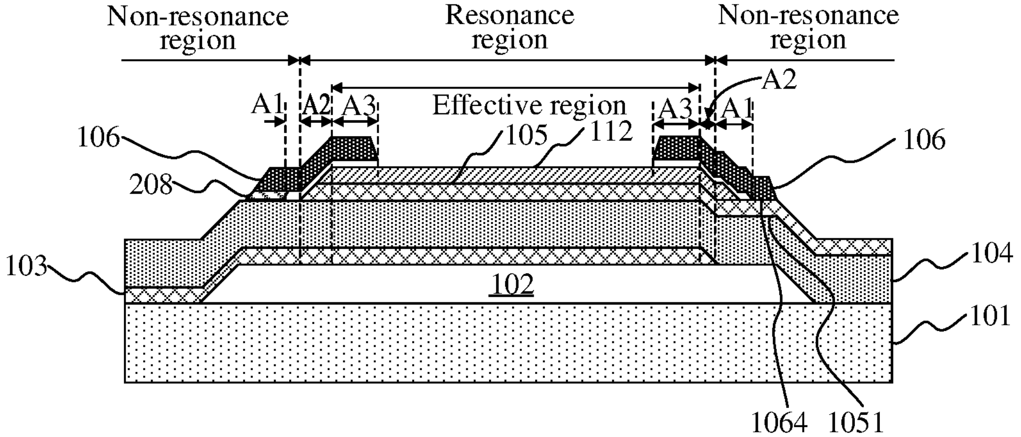

FIGS. 12-15 are section schematic diagrams of the process of a manufacturing method of a first bulk acoustic wave resonator according to an embodiment of the disclosure. FIGS. 16-18 are section schematic diagrams of the process of a manufacturing method of a second bulk acoustic wave resonator according to an embodiment of the disclosure. FIGS. 19-21 are section schematic diagrams of the process of a manufacturing method of a third bulk acoustic wave resonator according to an embodiment of the disclosure. The process of the manufacturing method shown in FIGS. 16-18 may be understood as being performed on the basis of the structure shown in FIG. 12. The process of the manufacturing method shown in FIGS. 19-21 may also be understood as being performed on the basis of the structure shown in FIG. 12.

Referring to FIGS. 12-15, or, FIGS. 16-18, or, FIGS. 19-21, in some embodiments, the resonance region includes an effective region and a second region A2 located between the effective region and a non-resonance region. A third region A3 includes a portion of the effective region adjacent to the second region A2. A first region A1, the second region A2, and the third region A3 constitute an edge region.

A suspended protruding block 106 is formed by the following operation.

The suspended protruding block 106 surrounding the edge region is formed on the piezoelectric layer 104 located outside the edge region, with a gap structure located between the suspended protruding block 106 and the piezoelectric layer 104 in the first region A1, between the suspended protruding block 106 and the sidewall of the second electrode layer 105 in the second region A2, and between the suspended protruding block 106 and the top surface of the second electrode layer 105 in the third region A3.

The operation S113 is performed referring to FIGS. 12-15. In some embodiments, the gap structure includes an air gap space. The suspended protruding block 106 surrounding the edge region is formed by the following operations.

Figure 13:
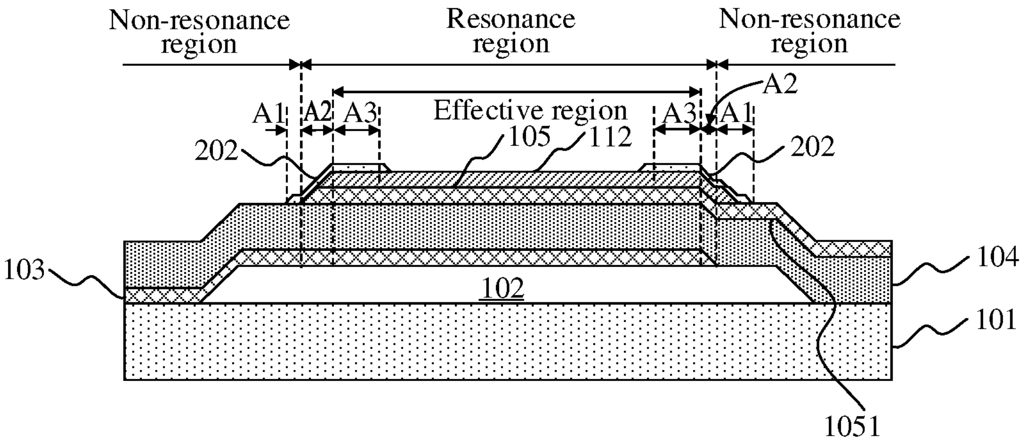

Referring to FIG. 13, a first dielectric layer 202 covering the edge region is formed. The material of the first dielectric layer 202 includes a low acoustic impedance material.

Figure 14:
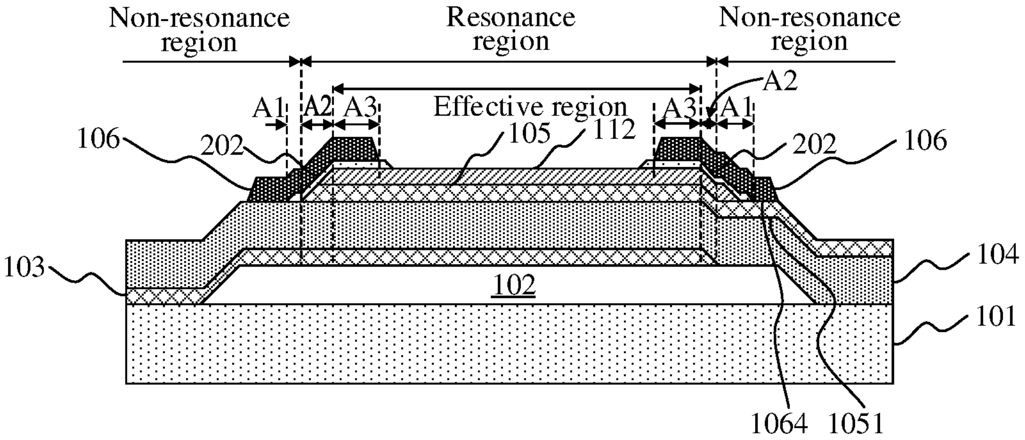

Referring to FIG. 14, the suspended protruding block 106 is formed. The suspended protruding block 106 covers the first dielectric layer 202 and covers the top surface of a portion of the piezoelectric layer 104 located outside the edge region.

Figure 15:
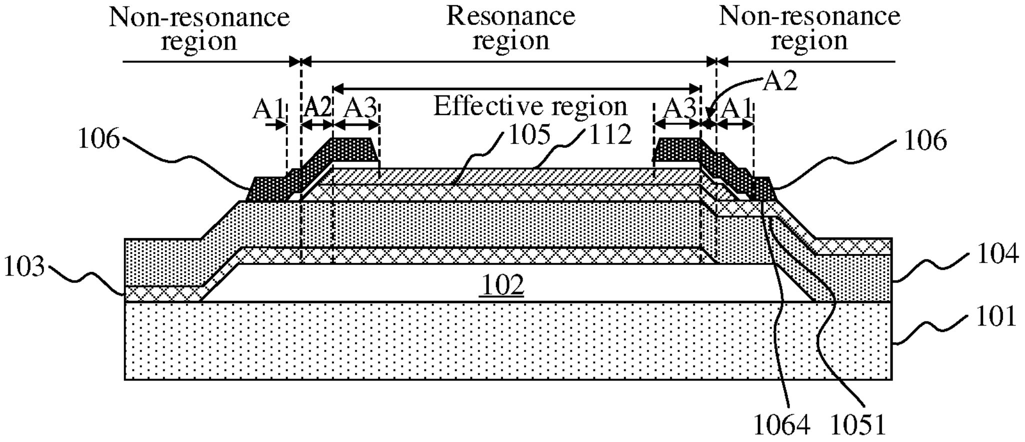

Referring to FIG. 15, at least a portion of the first dielectric layer 202 is removed to obtain the air gap space.

The suspended protruding block 106 is at least partially separated from the second electrode layer 105 in the edge region and the piezoelectric layer 104 in the edge region by the air gap space. The suspended protruding block 106 is in contact with the portion of the piezoelectric layer 104 located outside the edge region.

Here, the material of the suspended protruding block 106 and the material of the second electrode layer 105 may be the same or different, and the material of the suspended protruding block 106 may be a high acoustic impedance metal material, such as Mo, Ag, Al, or the like. The material of the second dielectric layer 204 includes a low acoustic impedance material, and the material of the first dielectric layer 202 may specifically include, but is not limited to, $SiO_2$.

Exemplarily, the gap structure obtained by removing all the first dielectric layer 202 is an air gap, and the suspended protruding block 106 is separated from the top surface of the portion of the piezoelectric layer 104 outside the edge region, and the sidewall and the top surface of the second electrode layer 105 in the edge region by the air gap.

Here, from the top surface of the second electrode layer 105 in the edge region, in the direction towards the sidewall of the second electrode layer 105 in the edge region, and then in the direction towards the top surface of the portion of the piezoelectric layer 104 outside the edge region, at least a portion of the first dielectric layer 202 is removed to obtain the air gap space. The obtained gap structure includes the air gap and a portion of the first dielectric layer 202.

Exemplarily, the gap structure obtained by removing at least a portion of the first dielectric layer 202 located on the top surface of the second electrode layer 105 in the edge region is composed of an air gap and a portion of the first dielectric layer 202. The suspended protruding block 106 is separated from the top surface of the portion of the piezoelectric layer 104 outside the edge region and the sidewall of the second electrode layer 105 in the edge region by the first dielectric layer 202. The suspended protruding block 106 is at least partially separated from the top surface of the second electrode layer 105 in the edge region by the air gap.

In FIGS. 16-18, the operation S113 is performed. In some embodiments, the gap structure includes an air gap space. The suspended protruding block surrounding the edge region is formed by the following operations.

Referring to FIG. 16, a second dielectric layer 204 is formed, and the second dielectric layer 204 covers the edge region and a portion of the piezoelectric layer 104 located outside the edge region. The material of the second dielectric layer 204 includes a low acoustic impedance material.

Referring to FIG. 17, the suspended protruding block 106 covering the second dielectric layer 204 is formed.

Referring to FIG. 18, at least a portion of the second dielectric layer is removed to obtain the air gap space.

The suspended protruding block 106 is at least partially separated from the second electrode layer 105 in the edge region and the piezoelectric layer 104 in the edge region by the air gap space. The suspended protruding block 106 is separated from the portion of the piezoelectric layer 104 located outside the edge region by a portion of the second dielectric layer 204 which is not removed.

Here, the material of the suspended protruding block 106 and the material of the second electrode layer 105 may be the same or different, and the material of the suspended protruding block 106 may be a high acoustic impedance metal material, such as Mo, Ag, Al, or the like. The material of the second dielectric layer 204 includes a low acoustic impedance material, and the material of the second dielectric layer 204 may specifically include, but is not limited to, $Si_3N_4$.

Here, from the top surface of the second electrode layer 105 in the edge region, in the direction towards the sidewall of the second electrode layer 105 in the edge region, and then in the direction towards the top surface of the portion of the piezoelectric layer 104 outside the edge region, at least a portion of the second dielectric layer 204 is removed to obtain the air gap space. The obtained gap structure includes the air gap and a portion of the second dielectric layer 204.

Exemplarily, the gap structure obtained by removing at least a portion of the second dielectric layer 204 located on the top surface of the second electrode layer 105 in the edge region is composed of an air gap and a portion of the second dielectric layer 204. The suspended protruding block 106 is separated from the top surface of the portion of the piezoelectric layer 104 outside the edge region and the sidewall of the second electrode layer 105 in the edge region by the second dielectric layer 204. The suspended protruding block 106 is at least partially separated from the top surface of the second electrode layer 105 in the edge region by the air gap.

In this way, the structural stability of the suspended protruding block 106 may be improved, and in the subsequent process, the edge of the second electrode layer 105 may be protected.

In FIGS. 19-21, the operation S113 is performed. In some embodiments, the gap structure includes an air gap space. the suspended protruding block surrounding the edge region is formed by the following operations.

Referring to FIG. 19, a first sacrificial layer 206 covering the edge region is formed. The material of the first sacrificial layer 206 includes a low acoustic impedance material.

Referring to FIG. 19, a third dielectric layer 208 is formed, and the third dielectric layer 208 covers the top surface of a portion of the piezoelectric layer 104 located outside the edge region and adjacent to the first sacrificial layer 206. The material of the third dielectric layer 208 includes a low acoustic impedance material, and the material of the first sacrificial layer 206 is different from the material of the third dielectric layer 208.

Referring to FIG. 20, the suspended protruding block is formed, and the suspended protruding block covers the first sacrificial layer 206 and the top surface of the third dielectric layer 208.

Referring to FIG. 21, at least a portion of the first sacrificial layer 206 is removed to obtain the air gap space.

The suspended protruding block 106 is at least partially separated from the second electrode layer 105 in the edge region and the piezoelectric layer 104 in the edge region by the air gap space. The suspended protruding block 106 is electrically isolated from the portion of the piezoelectric layer 104 located outside the edge region by the third dielectric layer 208.

Here, the material of the suspended protruding block 106 and the material of the second electrode layer 105 may be the same or different, and the material of the suspended protruding block 106 may be a high acoustic impedance metal material, such as Mo, Ag, Al, or the like. The material of the first sacrificial layer 206 includes a low acoustic impedance material, and the material of the first sacrificial layer 206 may specifically include, but is not limited to, $SiO_2$. The material of the third dielectric layer 208 includes a low acoustic impedance material, and the material of the third dielectric layer 208 may specifically include, but is not limited to, $Si_3N_4$.

Exemplarily, the gap structure obtained by removing all the first sacrificial layer 206 is an air gap, and the suspended protruding block 106 is separated from the top surface of the portion of the piezoelectric layer 104 outside the edge region and the sidewall and the top surface of the second electrode layer 105 in the edge region by the air gap. The third dielectric layer 208 that is not removed may be understood as the aforementioned pad 1063.

Here, from the top surface of the second electrode layer 105 in the edge region, in the direction towards the sidewall of the second electrode layer 105 in the edge region, and then in the direction towards the top surface of the portion of the piezoelectric layer 104 outside the edge region, at least a portion of the first sacrificial layer 206 is removed to obtain the air gap space. The obtained gap structure includes the air gap and a portion of the first sacrificial layer 206.

Exemplarily, the gap structure obtained by removing at least a portion of the first sacrificial layer 206 located on the top surface of the second electrode layer 105 in the edge region is composed of an air gap and a portion of the first sacrificial layer 206. The suspended protruding block 106 is separated from the top surface of the portion of the piezoelectric layer 104 outside the edge region and the sidewall of the second electrode layer 105 in the edge region by the first sacrificial layer 206. The suspended protruding block 106 is at least partially separated from the top surface of the second electrode layer 105 in the edge region by the air gap.

The gap structure including the air gap in the bulk acoustic wave resonator obtained by the above manufacturing method of the bulk acoustic wave resonator, referring to FIG. 15, or FIG. 18, or FIG. 21, is only one example of the embodiments of the disclosure, and is not used to limit the characteristics of the bulk acoustic wave resonator of the embodiments of the disclosure. Other examples of the bulk acoustic wave resonator of the embodiments of the disclosure are shown in the later embodiments.

Referring to FIG. 15, or FIG. 18, or FIG. 21, in some embodiments, the material of the gap structure includes at least one of an air gap or a low acoustic impedance material. Exemplarily, the material of the gap structure includes an air gap, or, the material of the gap structure includes an air gap and a low acoustic impedance material.

Referring to FIGS. 12-15, or FIGS. 16-18, or FIGS. 19-21, in some embodiments, the suspended protruding block 106 is further formed by the following operation.

The suspended protruding block 106 is formed, and the suspended protruding block 106 covers the top surface of the lead wire 1051 of a portion of the second electrode layer 105 located outside the edge region. The suspended protruding block 106 is in contact with and electrically connected to the lead wire 1051 of the portion of the second electrode layer located outside the edge region.

Here, the suspended protruding block 106 is in contact with and electrically connected to the lead wire 1051 of the second electrode layer, and the capacitance which is introduced into the effective region is electrically in-phase with the resonator. Therefore, no additional parasitic resonance is introduced.

Other parts that are not mentioned of the manufacturing method of the bulk acoustic wave resonator in the embodiments of the disclosure may be referred to the description in the aforementioned embodiments of the bulk acoustic wave resonator and will not be repeated here.

It is to be noted that the influence law of the effectiveness and parameter changes of the suspended protruding block on the performance is proposed in the disclosure based on the theoretical explanations and test results, but it is necessary to select the actual preferred parameters according to the actual process.

As can be understood by those skilled in the art, the above embodiments are specific embodiments for realizing the disclosure, and that various changes may be made thereto in form and detail in a practical application, without deviating from the spirit and scope of the disclosure. Any variations or replacements apparent to those skilled in the art within the technical scope disclosed by the disclosure shall fall within the scope of protection of the disclosure.

INDUSTRIAL APPLICABILITY

Embodiments of the disclosure provide a bulk acoustic wave resonator and a manufacturing method. With the bulk acoustic wave resonator, an acoustic wave may encounter two impedance mismatch interfaces during the transverse transmission process, such that the acoustic loss caused by the acoustic wave leakage is further reduced, and the global quality factor Q value of the acoustic wave device may be improved.

The invention claimed is:

1. A bulk acoustic wave resonator, comprising:

a substrate;

a reflective structure, a first electrode layer, a piezoelectric layer, and a second electrode layer which are sequentially stacked on the substrate; and a suspended protruding block, located on the piezoelectric layer outside an edge region, wherein the suspended protruding block at least surrounds the edge region, with a gap structure located between the suspended protruding block and the piezoelectric layer in the edge region and between the suspended protruding block and the second electrode layer in the edge region; a top surface of the suspended protruding block is higher than a top surface of the second electrode layer, and the edge region comprises a portion of a non-resonance region adjacent to a resonance region, the suspended protruding block comprises a first protruding block column which extends to a portion of the piezoelectric layer located outside the edge region, wherein a material of the first protruding block column comprises at least one of an electrically conductive material or an insulating material; or the suspended protruding block comprises a second protruding block column which extends to a pad, wherein the pad is located on a portion of the piezoelectric layer located outside the edge region, the second protruding block column is electrically isolated from the piezoelectric layer by the pad, a material of the second protruding block column comprises an electrically conductive material, and a material of the pad comprises at least one of a low acoustic impedance material or an insulating material.

2. The resonator of claim 1, wherein a width of a contact part between the suspended protruding block and the piezoelectric layer is less than a width of a non-contact part between the suspended protruding block and the piezoelectric layer.

3. The resonator of claim 1, wherein the resonance region comprises an effective region and a second region located between the effective region and the non-resonance region, and a portion of the non-resonance region adjacent to the second region is a first region;

when the first region constitutes the edge region, the suspended protruding block surrounds the first region, with the gap structure located between the suspended protruding block and the piezoelectric layer in the first region and between the suspended protruding block and a sidewall of the second electrode layer; or when the first region and the second region constitute the edge region, the suspended protruding block surrounds the first region and the second region, with the gap structure located between the suspended protruding block and the piezoelectric layer in the first region, and between the suspended protruding block and a sidewall of the second electrode layer in the second region.

4. The resonator of claim 1, wherein the resonance region comprises an effective region and a second region located between the effective region and the non-resonance region; a first region comprises a portion of the non-resonance region adjacent to the second region; a third region comprises a portion of the effective region adjacent to the second region; and the first region, the second region and the third region constitute the edge region;

wherein the suspended protruding block surrounds the edge region, with the gap structure located between the suspended protruding block and the piezoelectric layer in the edge region, between the suspended protruding block and a sidewall of the second electrode layer in the edge region, and between the suspended protruding block and the top surface of the second electrode layer in the edge region.

5. The resonator of claim 4, wherein the suspended protruding block further comprises an extension part, the extension part surrounds a fourth region, with a gap structure located between the extension part and the piezoelectric layer in the fourth region, and between the extension part and a lead wire of the second electrode layer in the fourth region, and the fourth region comprises a portion of the non-resonance region located outside a contact region between the suspended protruding block and the piezoelectric layer, wherein the extension part extends in a direction of a width and height of the suspended protruding block, and/or the extension part extends along a top surface of the piezoelectric layer.

6. The resonator of claim 4, wherein a ratio of a thickness of the suspended protruding block located in the third region to a thickness of the second electrode layer ranges from 1 to 50, and/or the suspended protruding block located in the third region has a first thickness and a first width, the first thickness ranges from 0.5 μm to 5 μm, and the first width ranges from 1 μm to 10 μm.

7. The resonator of claim 4, wherein the suspended protruding block located in the third region has a first distance from a top surface of the resonance region, and a ratio of the first distance to a thickness of the second electrode layer ranges from 1 to 15, and/or the suspended protruding block located in the third region has a first distance from an edge of the resonance region, and the first distance ranges from 0.5 μm to 1.5 μm.

8. The resonator of claim 1, wherein the first protruding block column or the pad has a second width, and the second width ranges from 1 μm to 3 μm, and/or the first protruding block column or the pad has a second distance from an edge of the resonance region, and the second distance ranges from 1 μm to 3 μm.

9. The resonator of claim 1, wherein a material of the suspended protruding block comprises the electrically conductive material, and a material of the gap structure comprises at least one of an air gap or the low acoustic impedance material.

10. The resonator of claim 1, wherein the suspended protruding block is in contact with a lead wire of the second electrode layer, the suspended protruding block comprises a connection part which extends to the lead wire of the second electrode layer outside the edge region, and the connection part is in contact with and electrically connected to the lead wire of the second electrode layer.

11. The resonator of claim 10, further comprising a frequency modulation layer, wherein:

the frequency modulation layer covers the second electrode layer, and the connection part is in contact with and electrically connected to the lead wire of the second electrode layer; or, the frequency modulation layer covers the second electrode layer and the lead wire of the second electrode layer, the connection part penetrates the frequency modulation layer such that the connection part is in contact with and electrically connected to the lead wire of the second electrode layer.

12. The resonator of claim 11, wherein the suspended protruding block located in the resonance region has a first thickness, and a ratio of the first thickness to a sum of a thickness of the second electrode layer and a thickness of the frequency modulation layer ranges from 0.5 to 5, and/or a sum of a thickness of the second electrode layer and a thickness of the frequency modulation layer is less than or equal to 1 μm.

13. The resonator of claim 1, wherein the second electrode layer has an inclined side.

14. The resonator of claim 1, wherein the suspended protruding block is not in contact with a lead wire of the second electrode layer.

15. A manufacturing method of a bulk acoustic wave resonator, comprising:

providing a substrate;

forming a reflective structure, a first electrode layer, a piezoelectric layer, and a second electrode layer which are sequentially stacked on the substrate; and forming a suspended protruding block located on the piezoelectric layer outside an edge region, wherein the suspended protruding block at least surrounds the edge region, with a gap structure located between the suspended protruding block and the piezoelectric layer in the edge region, and between the suspended protruding block and the second electrode layer in the edge region, a top surface of the suspended protruding block is higher than a top surface of the second electrode layer, and the edge region comprises a portion of a non-resonance region adjacent to a resonance region, wherein the resonance region comprises an effective region and a second region located between the effective region and the non-resonance region; a first region comprises a portion of the non-resonance region adjacent to the second region; a third region comprises a portion of the effective region adjacent to the second region; and the first region, the second region and the third region constitute the edge region;

wherein forming the suspended protruding block comprises:

forming the suspended protruding block surrounding the edge region on the piezoelectric layer located outside the edge region, with the gap structure located between the suspended protruding block and the piezoelectric layer in the edge region, between the suspended protruding block and a sidewall of the second electrode layer in the second region, and between the suspended protruding block and the top surface of the second electrode layer in the third region; and wherein the gap structure comprises an air gap space, and forming the suspended protruding block surrounding the edge region comprises:

forming a first dielectric layer covering the edge region, wherein a material of the first dielectric layer comprises a low acoustic impedance material;

forming the suspended protruding block covering the first dielectric layer and covering a top surface of a portion of the piezoelectric layer located outside the edge region; and removing at least a portion of the first dielectric layer to obtain the air gap space, wherein the suspended protruding block is at least partially separated from the second electrode layer in the edge region and the piezoelectric layer in the edge region by the air gap space, and the suspended protruding block is in contact with the portion of the piezoelectric layer located outside the edge region.

16. The method of claim 15, wherein forming the suspended protruding block further comprises:

forming the suspended protruding block covering a top surface of a lead wire of a portion of the second electrode layer located outside the edge region, wherein the suspended protruding block is in contact with and electrically connected to the lead wire of the portion of the second electrode layer located outside the edge region.

17. A manufacturing method of a bulk acoustic wave resonator, comprising:

providing a substrate;

forming a reflective structure, a first electrode layer, a piezoelectric layer, and a second electrode layer which are sequentially stacked on the substrate; and forming a suspended protruding block located on the piezoelectric layer outside an edge region, wherein the suspended protruding block at least surrounds the edge region, with a gap structure located between the suspended protruding block and the piezoelectric layer in the edge region, and between the suspended protruding block and the second electrode layer in the edge region, a top surface of the suspended protruding block is higher than a top surface of the second electrode layer, and the edge region comprises a portion of a non-resonance region adjacent to a resonance region, wherein the resonance region comprises an effective region and a second region located between the effective region and the non-resonance region; a first region comprises a portion of the non-resonance region adjacent to the second region; a third region comprises a portion of the effective region adjacent to the second region; and the first region, the second region and the third region constitute the edge region;

wherein forming the suspended protruding block comprises:

forming the suspended protruding block surrounding the edge region on the piezoelectric layer located outside the edge region, with the gap structure located between the suspended protruding block and the piezoelectric layer in the edge region, between the suspended protruding block and a sidewall of the second electrode layer in the second region, and between the suspended protruding block and the top surface of the second electrode layer in the third region; and wherein the gap structure comprises an air gap space, and forming the suspended protruding block surrounding the edge region comprises:

forming a second dielectric layer covering the edge region and a portion of the piezoelectric layer located outside the edge region, wherein a material of the second dielectric layer comprises a low acoustic impedance material;

forming the suspended protruding block covering the second dielectric layer; and removing at least a portion of the second dielectric layer to obtain the air gap space, wherein the suspended protruding block is at least partially separated from the second electrode layer in the edge region and the piezoelectric layer in the edge region by the air gap space, and the suspended protruding block is separated from the portion of the piezoelectric layer located outside the edge region by a portion of the second dielectric layer which is not removed.

18. The method of claim 17, wherein the second dielectric layer comprises a first sacrificial layer and a third dielectric layer, wherein the first sacrificial layer covers the edge region, and the third dielectric layer covers a top surface of the portion of the piezoelectric layer located outside the edge region and is adjacent to the first sacrificial layer, wherein a low acoustic impedance material of the first sacrificial layer is different from a low acoustic impedance material of the third dielectric layer, and wherein removing at least the portion of the second dielectric layer to obtain the air gap space comprises:

removing at least a portion of the first sacrificial layer to obtain the air gap space, wherein the suspended protruding block is electrically isolated from the portion of the piezoelectric layer located outside the edge region by the third dielectric layer.

19. The method of claim 17, wherein forming the suspended protruding block further comprises:

forming the suspended protruding block covering a top surface of a lead wire of a portion of the second electrode layer located outside the edge region, wherein the suspended protruding block is in contact with and electrically connected to the lead wire of the portion of the second electrode layer located outside the edge region.

* * * * *